United States Patent
Effenberger et al.

(10) Patent No.: US 9,967,882 B2
(45) Date of Patent: May 8, 2018

(54) FREQUENCY-DIVISION MULTIPLEXING (FDM) USING SOFT CLIPPING (SC)

(71) Applicant: Futurewei Technologies, Inc., Plano, TX (US)

(72) Inventors: Frank Effenberger, Colts Neck, NJ (US); Xiang Liu, Marlboro, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 226 days.

(21) Appl. No.: 14/997,117

(22) Filed: Jan. 15, 2016

(65) Prior Publication Data
US 2016/0212747 A1 Jul. 21, 2016

Related U.S. Application Data

(60) Provisional application No. 62/105,083, filed on Jan. 19, 2015.

(51) Int. Cl.
| | |
|---|---|
| *H04W 4/00* | (2018.01) |
| *H04W 72/04* | (2009.01) |
| *H04L 27/00* | (2006.01) |
| *H04L 5/00* | (2006.01) |
| *H03G 3/30* | (2006.01) |
| *H03G 9/00* | (2006.01) |

(52) U.S. Cl.
CPC ........... *H04W 72/0453* (2013.01); *H04L 5/00* (2013.01); *H04L 27/00* (2013.01); *H03G 3/3052* (2013.01); *H03G 3/3089* (2013.01); *H03G 9/005* (2013.01)

(58) Field of Classification Search
CPC ...................................... H04W 4/00

USPC ........................................... 370/329
See application file for complete search history.

(56) References Cited

U.S. PATENT DOCUMENTS

| | | | | |
|---|---|---|---|---|
| 6,128,276 | A | * 10/2000 | Agee ...................... | H04B 1/692 370/208 |
| 2010/0296386 | A1 | 11/2010 | Liu et al. | |
| 2013/0039439 | A1 | 2/2013 | Kameya | |
| 2015/0365934 | A1 | 12/2015 | Liu et al. | |

FOREIGN PATENT DOCUMENTS

| | | |
|---|---|---|
| CN | 102571178 A | 7/2012 |
| CN | 103227768 A | 7/2013 |
| WO | 2009086726 A1 | 7/2009 |

OTHER PUBLICATIONS

Foreign Communication From a Counterpart Application, PCT Application No. PCT/CN2016/071336, International Search Report dated Apr. 22, 2016, 7 pages.

(Continued)

*Primary Examiner* — Dang Ton
(74) *Attorney, Agent, or Firm* — Conley Rose, P.C.

(57) ABSTRACT

A method comprising mapping data onto odd frequency subcarriers of a plurality of non-overlapping frequency subcarriers, wherein each of the non-overlapping frequency subcarriers comprises a center frequency that is an odd integer multiple of a lowest center frequency, producing a time signal based on the mapping, applying soft clipping (SC) to signal amplitudes of the time signal according to a polynomial function, and producing a positive-amplitude signal based on the applying.

19 Claims, 14 Drawing Sheets

(56) References Cited

OTHER PUBLICATIONS

Foreign Communication From a Counterpart Application, PCT Application No. PCT/CN2016/071336, Written Opinion dated Apr. 22, 2016, 4 pages.
Armstrong, et al., "Comparison of Asymmetrically Clipped Optical OFDM and DC-Biased Optical OFDM in AWGN," IEEE Communications Letters, vol. 12, No. 5, May 2008, pp. 343-345.
Armstrong, "OFDM for Optical Communications," Journal of Lightwave Technology, vol. 27, No. 3, Feb. 1, 2009, pp. 189-204.
Armstrong, et al., "Power Efficient Optical OFDM," IEEE Electronics Letters, Mar. 16, 2006, vol. 42. No. 6, pp. 370-371.
Effenberger, et al., "Power-Efficient Method for IM-DD Optical Transmission of Multiple OFDM Signals," Optics Express, vol. 23, No. 10, May 18, 2015, pp. 13571-13577.
Liu, et al., "Channel Mapping for an Aggregated Touchless Wireless Fronthaul," U.S. Appl. No. 14/921,021, filed Oct. 23, 2015, 52 pages.
Andréet al., "Analytical Formulation for SNR Prediction in DMDD OFDM-Based Access Systems," IEEE Photonics Technology Letters, vol. 26, No. 12, Jun. 15, 2014, pp. 1255-1258.
"Common Public Radio Interface (CPRI); Interface Specification" CPRI Specification V6.0, Aug. 30, 2013, 128 pages.
"C-RAN—The Road Towards Green RAN," White Paper, China Mobile Research Institute, Version 2.5, Oct. 2011, 48 pages.
Cvijetic, et al., "SDN-controlled topology-reconfigurable optical mobile fronthaul architecture for bidirectional CoMP and low latency inter-cell D2D in the 5G mobile era," Optical Society of America, vol. 22, No. 17, DOI: 10.1364/oe.22.020809, Optics Express 20809, Aug. 20, 2014, 7 pages.
Liu, et al., "Demonstration of Bandwidth-Efficient Mobile Fronthaul Enabling Seamless Aggregation of 36 E-UTRA-Like Wireless Signals in a Single 1.1-GHz Wavelength Channel," M2J. 2.pdf, Optical Society of America, 2015, 3 pages.
Liu, et al., "Efficient Mobile Fronthaul Transmission of Multiple LTE-A Signals with 36.86-Gb/s CPRI-Equivalent Data Rate Using a Directly-Modulated Laser and Fiber Dispersion Mitigation," Optical Society of America, Nov. 11, 2014, 3 pages.
Nesset, "NG-PON2 Technology and Standards," Journal of Lightwave Technology, vol. 33, No. 5, Mar. 1, 2015, pp. 1136-1143.
Pizzinat, et al., "Things You Should Know About Fronthaul," Tu.4.2.1, ECOC 2014, Cannes, France, 3 pages.

* cited by examiner

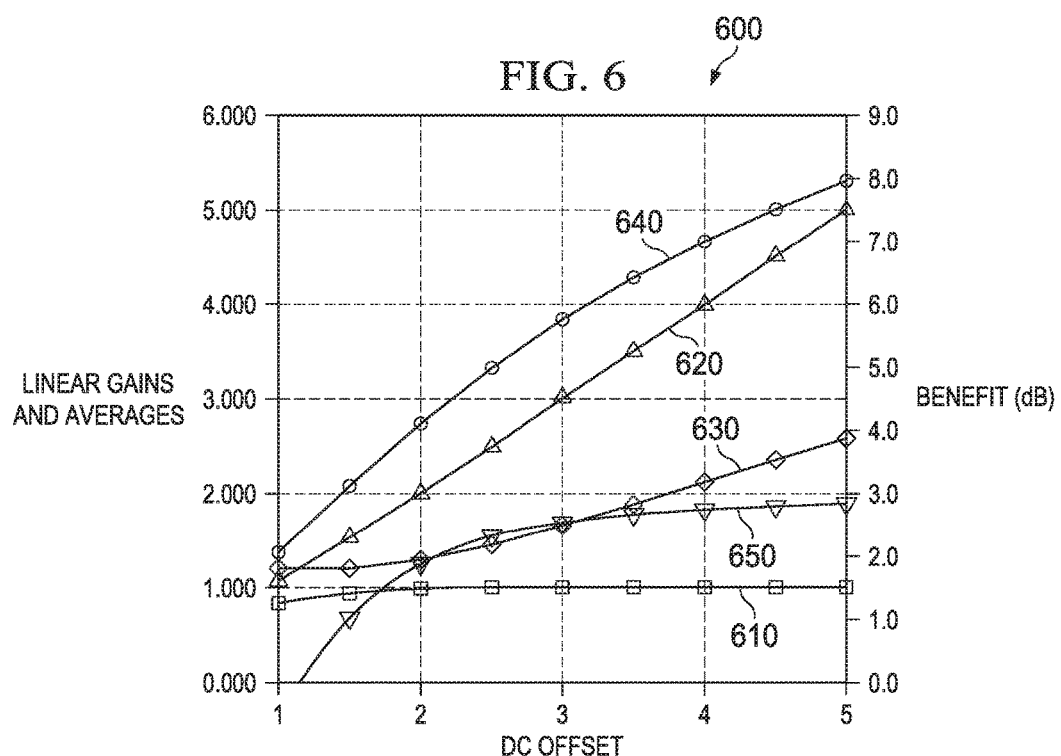
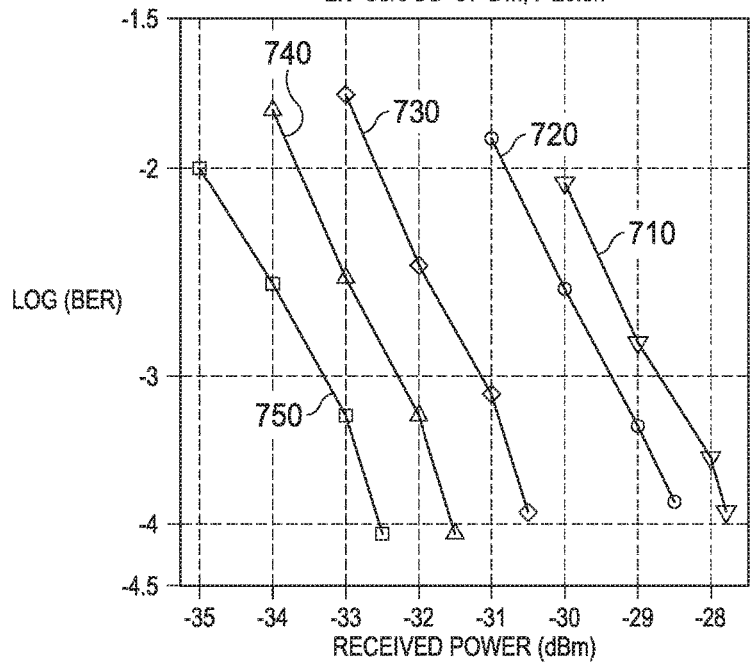

FREQUENCY-DIVISION MULTIPLEXING (FDM) USING SOFT CLIPPING (SC)

CROSS-REFERENCE TO RELATED APPLICATIONS

The present application claims priority to U.S. Provisional Patent Application 62/105,083, filed Jan. 19, 2015 by Frank Effenberger and Xiang Liu, and entitled "Frequency-Division Multiplexing (FDM) Using Soft Clipping (SC)," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A radio access network (RAN) refers to a network between mobile devices and a core network. In traditional wireless macro-cell networks, an area may be divided geographically into a plurality of cells and cell sectors, each served by a wireless base station communicating with a core network. The part of the RAN between the wireless base stations and the core network is referred to as the wireless backhaul. As the demand for high-speed wireless communications continues to increase, reaching the limits of macro cells in terms of the number of locations and penetration capability in indoor or densely-populated areas, research and industry are moving towards small-cell deployments with denser and smaller cells.

Wireless fronthaul and mobile fronthaul are emerging network segments that enable a cloud-radio access network (C-RAN) architecture suitable for small-cell deployments. In a C-RAN architecture, the digital baseband (BB) processing that is typically performed at wireless base stations located at remote cell sites is relocated to centralized baseband units (BBUs) located at a central site nearby a central office (CO) or core network. As such, the wireless base stations located at the remote cell sites are replaced by remote radio units (RRUs) that interface with antennas for wireless radio frequency (RF) transmission and reception without the digital BB processing. Wireless fronthaul refers to the part of the RAN between the RRUs and the BBUs. By relocating the digital BB processing to the centralized BBUs, the C-RAN architecture enables resource sharing and coordinated multipoint (CoMP) processing such as joint signal processing, joint interference mitigation, and joint scheduling among multiple cells and thus may improve network performance and efficiency. Thus, C-RAN is a promising enabling technology for supporting future wireless communications standards such as Fifth Generation (5G).

Wireless fronthaul may be enabled by optical fiber communication technologies, where optical fiber links transports signals between the RRUs located at the remote cell sites and the BBUs located at the central site. Some advantages of optical fiber transmission includes low power loss, low latency, and high bandwidth (BW). However, optical fiber and optical hardware add cost to the wireless fronthaul network. Thus, efficient usage of optical fiber and optical hardware are important in wireless fronthaul design.

SUMMARY

In one embodiment, the disclosure includes a method comprising mapping data onto odd frequency subcarriers of a plurality of non-overlapping frequency subcarriers, wherein each of the non-overlapping frequency subcarriers comprises a center frequency that is an odd integer multiple of a lowest center frequency, producing a time signal based on the mapping, applying soft clipping (SC) to signal amplitudes of the time signal according to a polynomial function, and producing a positive-amplitude signal based on the applying. In some embodiments, the disclosure also includes the polynomial function is a quadratic function, and/or wherein the applying the SC to the signal amplitudes of the time signal produces second-order distortions in the positive-amplitude signal, and/or optically modulating the positive-amplitude signal by using intensity modulation (IM) to produce an optical signal, and transmitting the optical signal over an optical link, and/or wherein the mapping comprises performing orthogonal frequency-division multiplexing (OFDM) to modulate the data onto the odd frequency subcarriers, and/or wherein the mapping comprises frequency multiplexing a plurality of frequency signals carrying the data onto the odd frequency subcarriers according to a channel map to produce an aggregated frequency signal, and/or wherein the producing the time signal further comprises performing complex conjugation on the aggregated frequency signal to produce an image signal, wherein the image signal comprises negative frequencies, adding the image signal to the aggregated frequency signal to produce a conjugate symmetric signal, performing inverse discrete Fourier transform (IDFT) on the conjugate symmetric signal to produce a real-valued signal in a time domain, and producing the time signal further based on the real-valued signal, and/or wherein the frequency signals correspond to wireless radio frequency (RF) channel signals in a wireless fronthaul, and/or wherein each of the non-overlapping frequency subcarriers comprises a first bandwidth, and wherein each of the frequency signals is constrained to a second bandwidth that is less than the first bandwidth.

In another embodiment, the disclosure includes a wireless fronthaul unit comprising an RF frontend configured to receive a plurality of wireless uplink (UL) channel signals, and a channel aggregation unit coupled to the RF frontend and configured to map the plurality of wireless UL channel signals onto first odd frequency subcarriers of a first plurality of non-overlapping frequency subcarrier to produce an aggregated frequency signal, wherein each of the first plurality of non-overlapping frequency subcarriers comprises a first center frequency that is an odd integer multiple of a lowest first center frequency, produce a first aggregated signal in a time domain based on the aggregated frequency signal, and apply a quadratic SC function to signal amplitudes of the first aggregated signal to produce a positive-amplitude signal, and/or the quadratic SC function comprises a direct-current (DC) offset that is based on a signal range of the first aggregated signal, and/or wherein the quadratic SC function comprises a quadratic term that is based on the signal amplitudes of the first aggregated signal, and/or wherein the quadratic SC function comprises a linear term that is based on the signal range and the signal amplitudes, and/or wherein the quadratic SC function is represented as:

$$Y_{SC} = \frac{X_M^2 + 2X_M X + X^2}{2X_M},$$

where X represents the first aggregated signal, $X_M$ represents the DC offset, and $Y_{SC}$ represents the positive-amplitude signal, and/or wherein the channel aggregation unit is further configured to determine the DC offset according to a standard deviation of the first aggregated signal, and/or further comprising an optical frontend coupled to the channel aggregation unit and configured to convert the first aggregated signal into an optical signal by using intensity modulation (IM), and transmit the optical signal over an optical wireless fronthaul link, and/or wherein the optical frontend is further configured to receive a second aggregated signal comprising a plurality of wireless downlink (DL) signals mapped onto second odd frequency subcarriers of a second plurality of non-overlapping frequency subcarriers, and wherein each of the second plurality of non-overlapping frequency subcarriers comprises a second center frequency that is an odd integer multiple of a lowest second center frequency.

In yet another embodiment, the disclosure includes a wireless fronthaul unit comprising a processor configured to map a plurality of wireless DL channel signals onto first odd frequency subcarriers of a first plurality of non-overlapping frequency subcarriers to produce an aggregated frequency signal, wherein each of the first plurality of non-overlapping frequency subcarriers comprises a first center frequency that is an odd integer multiple of a lowest first center frequency, produce a first aggregated signal in a time domain based on the aggregated frequency signal, apply a quadratic SC function to signal amplitudes of the first aggregated signal to produce a positive-amplitude signal, and an optical frontend coupled to the processor and configured to optically modulate the positive-amplitude signal by applying IM, and/or wherein the quadratic SC function comprises a DC component based on a signal range of the first aggregated signal, a quadratic component based on the signal amplitudes, and a linear component based on the signal range and the signal amplitudes, and/or wherein the optical frontend is further configured to receive a second aggregated signal by using direct detection (DD), wherein the second aggregated signal comprises a plurality of wireless UL signals mapped onto second odd frequency subcarriers of a second plurality of non-overlapping frequency subcarriers, and wherein each of the second plurality of non-overlapping frequency subcarriers comprises a second center frequency that is an odd integer multiple of a lowest second center frequency.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 6 is a graph comparing linear gains, signal averages, and power benefit of a direct-current offset (DCO) bias scheme, an asymmetric clipping (AC) bias scheme, and an SC bias scheme according to an embodiment of the disclosure.
FIG. 7 is a graph comparing bit error rate (BER) performance of a DCO bias scheme, an AC bias scheme, and an SC bias scheme according to an embodiment of the disclosure.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
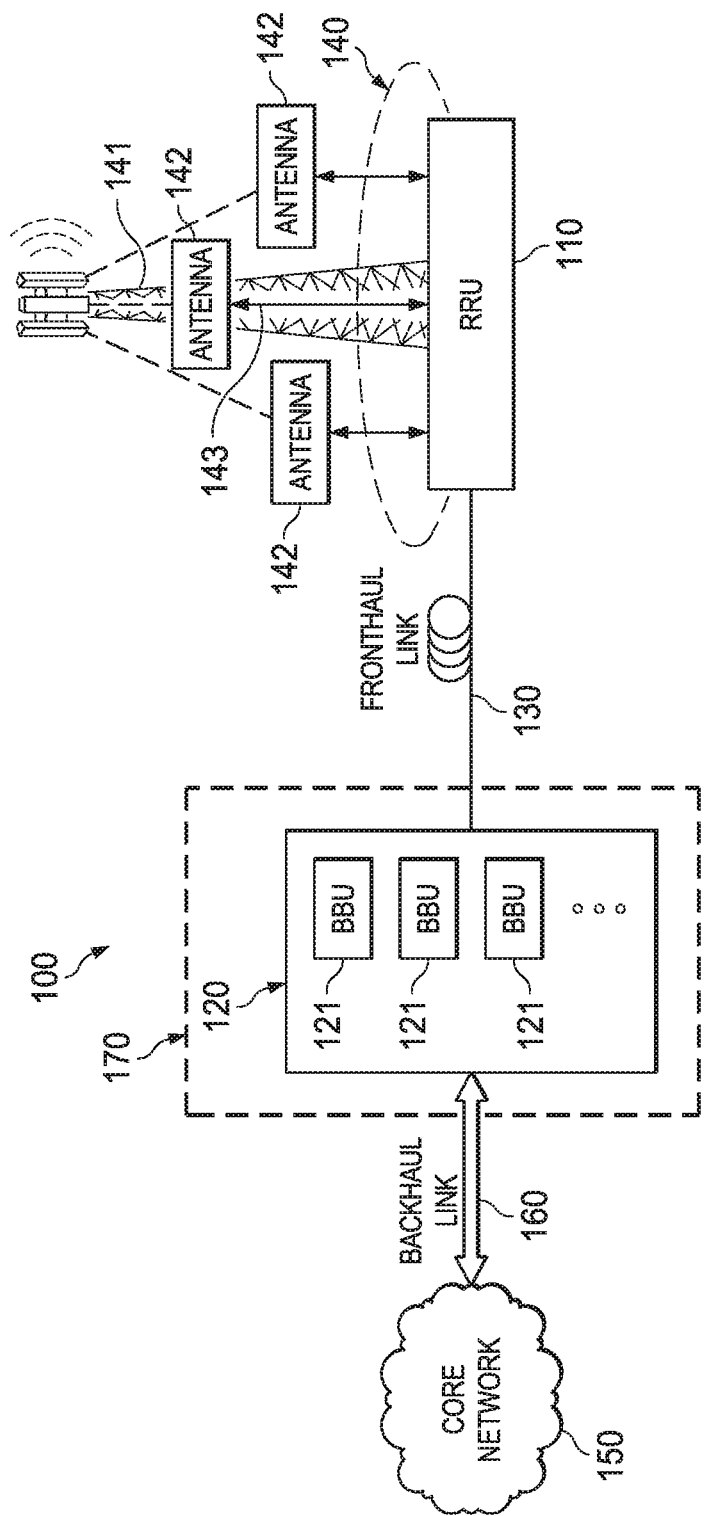
FIG. 1 is a schematic diagram of a C-RAN system.

FIG. 1 is a schematic diagram of a C-RAN system 100. The system 100 comprises an RRU 110 communicatively coupled to a BBU pool 120 through a fronthaul link 130. The RRU 110 is located at a remote cell site 140. The RRU 110 is typically installed at the bottom of a cell tower 141 that holds a plurality of antennas 142. The fronthaul link 130 is a cable link, a free-space link, or an optical fiber link configured to transport digital baseband signals between the RRU 110 and the BBU pool 120. A cable link comprises coaxial cables. A free-space link comprises a line-of-sight radio wave propagation path. An optical fiber link comprises a standard single-mode fiber (SSMF) or a multi-mode fiber (MMF). Since optical fibers provide significantly lower power loss, higher speed, and higher BW than cables, optical fibers are commonly employed for the fronthaul link 130 instead of cables. The BBU pool 120 is typically located at a central office (CO) site 170. The cell site 140 is a geographical area located at a remote location away from the CO site 170 and may comprise one or more cell sectors, which may be determined during network deployment by mobile operators. The RRU 110 serves a plurality of mobile stations located in the cell site 140. The BBU pool 120 connects the RRU 110 to a core network 150 via a backhaul link 160. The backhaul link 160 is substantially similar to the fronthaul link 130, but transports packets such as Ethernet packets between the BBU pool 120 and the core network 150. The core network 150 may comprise interconnected sub-networks operated by network providers and service providers. The core network 150 is a central part of a network that provides network services to the users of the mobile stations.

The RRU 110 is communicatively coupled to the antennas 142. The RRU 110 is a device configured to communicate with the mobile stations in designated wireless UL RF channels and designated wireless DL RF channels via the antennas 142. UL refers to the transmission direction from mobile stations towards a CO or a CO site 170, whereas DL refers to the transmission direction from the CO or the CO site 170 towards the mobile stations. Some examples of wireless RF channels include long-term evolution (LTE) channels, LTE-advanced (LTE-A) channels, or other evolved universal terrestrial radio access (E-UTRA) channels as defined in the third generation partnership project (3GPP) specifications.

The BBU pool 120 comprises a plurality of BBUs 121. The BBUs 121 are devices configured to perform BB DSP functions and wireless media access control (MAC) processing functions according to a wireless communication protocol.

In a UL direction, the RRU 110 receives UL RF signals from the mobile stations, aggregates the UL RF signals into an aggregated UL signal, and sends the aggregated UL signal to the BBU pool 120 via the fronthaul link 130. When a BBU 121 receives the aggregated UL signal from the RRU 110, the BBU 121 deaggregates the aggregated UL signal and performs BB processing and MAC processing on the deaggregated UL signals to recover the UL data packets transmitted by the mobile stations. The BBU 121 forwards the data packets to the core network 150. The BBUs 121 may coordinate with each other to jointly process one or more UL aggregated signals from one or more RRUs. The aggregation and deaggregation of the UL signals may be performed in a BB or an intermediate band (IB), as described more fully below.

In a DL direction, the core network 150 forwards DL data packets to the BBU pool 120 over the backhaul link 160. The DL data packets are destined to the mobile stations. The BBUs 121 generate DL signals for the mobile stations from corresponding DL data packets by performing BB processing and MAC processing. The BBUs 121 aggregate the DL signals into aggregated DL signals and transmit the aggregated DL signals to the RRU 110 via the fronthaul link 130. When the RRU 110 receives an aggregated DL signal from the BBU 121, the RRU 110 deaggregates the aggregated DL signal and transmits the deaggregated DL signals to the mobile stations in corresponding DL RF channels. The aggregation and deaggregation of the DL signals are similar to the aggregation and deaggregation of the UL signals, as described more fully below.

U.S. patent application Ser. No. 14/528,823 by Xiang Liu, et al., and titled "Aggregated Touchless Wireless Fronthaul," ("'823 Application"), which is incorporated by reference, describes an efficient wireless fronthaul system that digitally aggregates and deaggregates UL and DL signals in a BB or an IB by employing frequency-division multiplexing (FDM) and transports the digitized UL and DL BB signals over a fronthaul link such as the fronthaul link 130. The efficient wireless fronthaul system employs IM for optical transmission and DD for optical reception.

Figure 2:
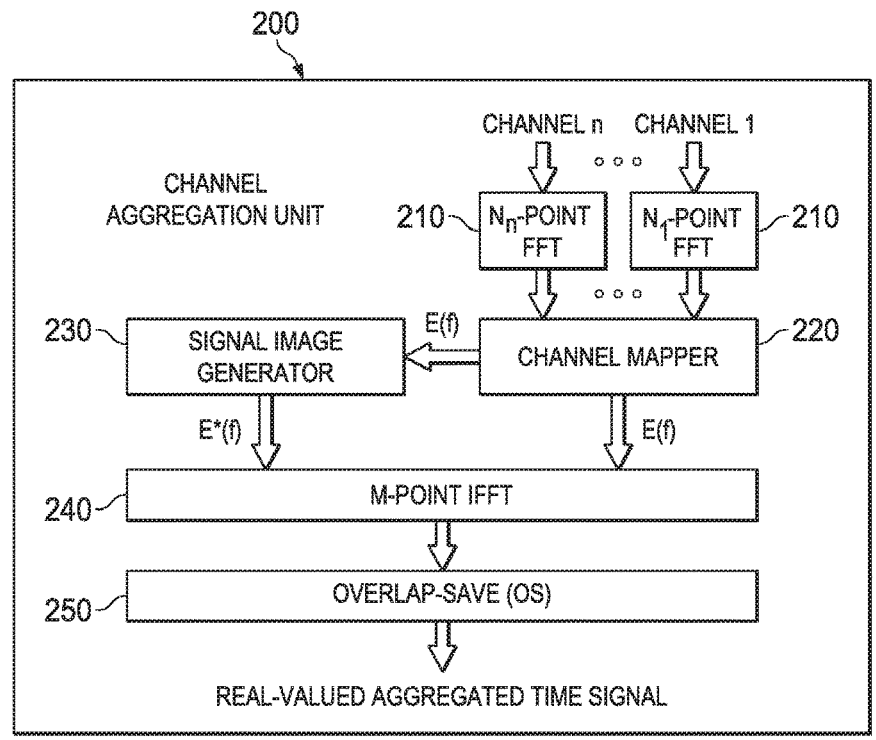
FIG. 2 is a schematic diagram of a digital channel aggregation unit.

FIG. 2 is a schematic diagram of a digital channel aggregation unit 200. The digital channel aggregation unit 200 is described in the '823 Application. The digital channel aggregation unit 200 is employed by the RRU 110 and the BBUs 121. When the digital channel aggregation unit 200 is employed at the RRU 110, the digital channel aggregation unit 200 receives UL BB or IB signals, which correspond to UL RF signals transmitted by mobile stations. When the digital channel aggregation unit 200 is employed at the BBUs 121, the digital channel aggregation unit 200 receives DL BB or IB signals, which carry DL packets generated by a core network such as the core network 150. The RRU 110 and the BBUs 121 employ an optical frontend to convert the output of the digital channel aggregation unit 200 into an optical signal and transmit the optical signal over the fronthaul link 130. The digital channel aggregation unit 200 comprises a plurality of fast Fourier transform (FFT) units 210, a channel mapper 220, a signal image generator 230, an inverse FFT (IFFT) unit 240, and an overlap-save (OS) unit 250.

The FFT units 210 are configured to transform input signals from a time domain into a frequency domain. Each FFT unit 210 operates on an input signal corresponding to a particular wireless RF channel (shown as channel 1, . . . channel n), which may comprise any suitable channel configuration. Each FFT unit 210 is configured to perform an N-point FFT, where N is a positive integer corresponding to the FFT size.

The channel mapper 220 is coupled to the FFT units 210 and configured to map the frequency signals produced by the FFT units 210 to adjacent non-overlapping frequency bands or FFT bins to produce an aggregated frequency signal, denoted as E(f). The aggregated frequency signal E(f) spans a positive frequency band between $f_{DC}$ and $f_{MAX}$, where $f_{DC}$ corresponds to the frequency bin number 0 at direct current frequency 0 Hz and $f_{MAX}$ corresponds to frequency bin number $$\frac{M}{2}+1,$$

where M is a positive integer.

The signal image generator 230 is coupled to the channel mapper 220 and configured to generate an image signal, $E^*(f)$, that is a complex conjugate of the signal E(f). For example, the signal $E^*(f)$ spans a negative frequency band between $f_{DC}$ and $f_{MIN}$, where $f_{MIN}$ corresponds to the frequency bin $$\frac{-M}{2}+1.$$

Thus, $E^*(f)=E(-f)$.

The IFFT unit 240 is coupled to the channel mapper 220 and the signal image generator 230 and configured to perform an M-point IFFT, where M is the IFFT size of the IFFT unit 240. The FFT size of the FFT units 210 and the IFFT size of the IFFT unit 240 are determined based on the sampling rates, the channel BWs of the input signals at the FFT units 210, and the number of signals for aggregation. The employment of the signal image generator 230 provides FFT symmetry or Hermitian symmetry. Thus, the output of the IFFT unit 240 is a real-valued aggregated time signal carrying an aggregation of the input signals. The OS unit 250 is coupled to the IFFT unit 240 and configured to combine successive real-valued time domain signals generated by the IFFT unit 240.

Figure 3:
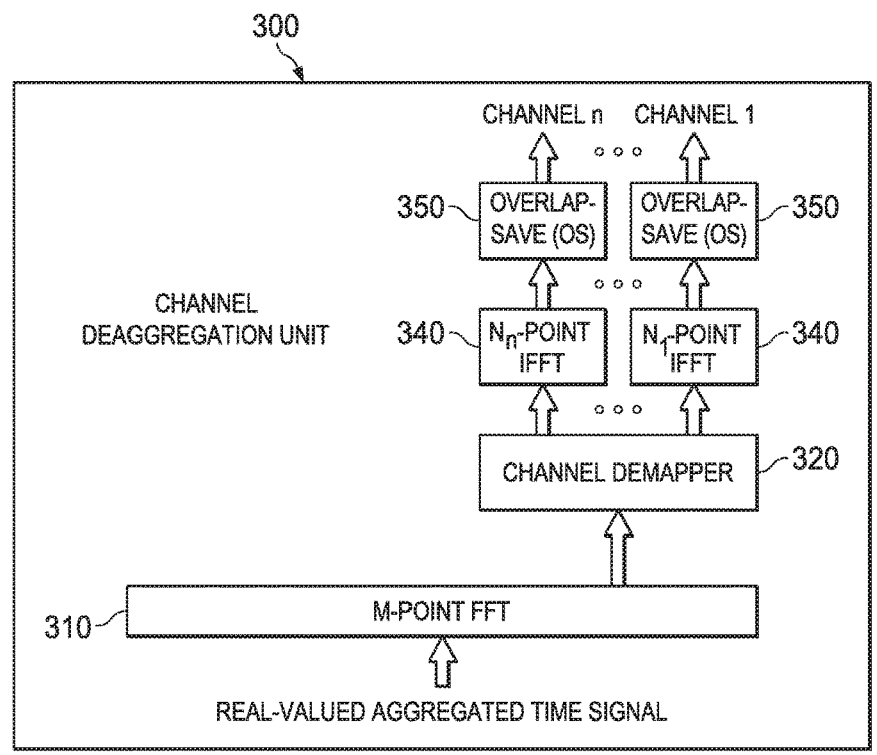
FIG. 3 is a schematic diagram of a digital channel deaggregation unit.

FIG. 3 is a schematic diagram of an embodiment of a digital channel deaggregation unit 300. The digital channel deaggregation unit 300 is described in the '823 Application. The digital channel deaggregation unit 300 is employed by the RRU 110 and the BBUs 121. The digital channel deaggregation unit 300 operates on input aggregated signals received from a fronthaul link such as the fronthaul link 130. When the digital channel deaggregation unit 300 is employed at the RRU 110, the input aggregated signals carry DL BB or IB signals that are destined for mobile stations. When the digital channel deaggregation unit 300 is employed at the BBUs 121, the input aggregated signals carry UL BB signals transmitted by the mobile stations. The digital channel deaggregation unit 300 comprises an FFT unit 310, a channel demapper 320, a plurality of IFFT units 340, and a plurality of OS units 350 similar to the OS unit 250.

The FFT unit 310 is similar to the FFT unit 210 and is configured to perform an M-point FFT to convert a real-valued aggregated time signal from a time domain to a frequency domain to produce a frequency signal. The real-valued aggregated time signal is similar to the output of the digital channel aggregation unit 200. The channel demapper 320 is coupled to the FFT unit 310 and configured to demultiplex the frequency signal at the positive frequency band, between $F_{DC}$ and $f_{MAX}$, into a plurality of frequency signals, each corresponding to a particular wireless channel (shown as channel 1, . . . channel n) according to a pre-determined channel map. The portion of the frequency signal located at the negative frequency band between $F_{DC}$ and $f_{MIN}$ may be discarded. The IFFT units 340 are similar to the IFFT unit 240 and are configured to perform an N-point IFFT.

When low-cost optical transmitters based on DMLs or electro-absorption modulators (EAMs) are used, the interplay between fiber dispersion and signal chirp causes a dispersion-induced penalty. The penalty increases when the aggregated signal bandwidth is relatively high. However, the penalty is primarily due to second-order mixing products of the original transmitted frequency subcarrier signals. One approach to mitigating the second-order mixing products is to map signals onto odd-only channels during channel aggregation as described in the U.S. patent application Ser. No. 14/921,021 by Xiang Liu, et al., and titled "Channel Mapping for an Aggregated Touchless Wireless Fronthaul," ("021 Application"), which is incorporated by reference. The odd-only channels refer to the frequency channels comprising odd integer multiples of a lowest center frequency in a signal band or frequency channels with odd channel indices, as described more fully below.

Figure 4:
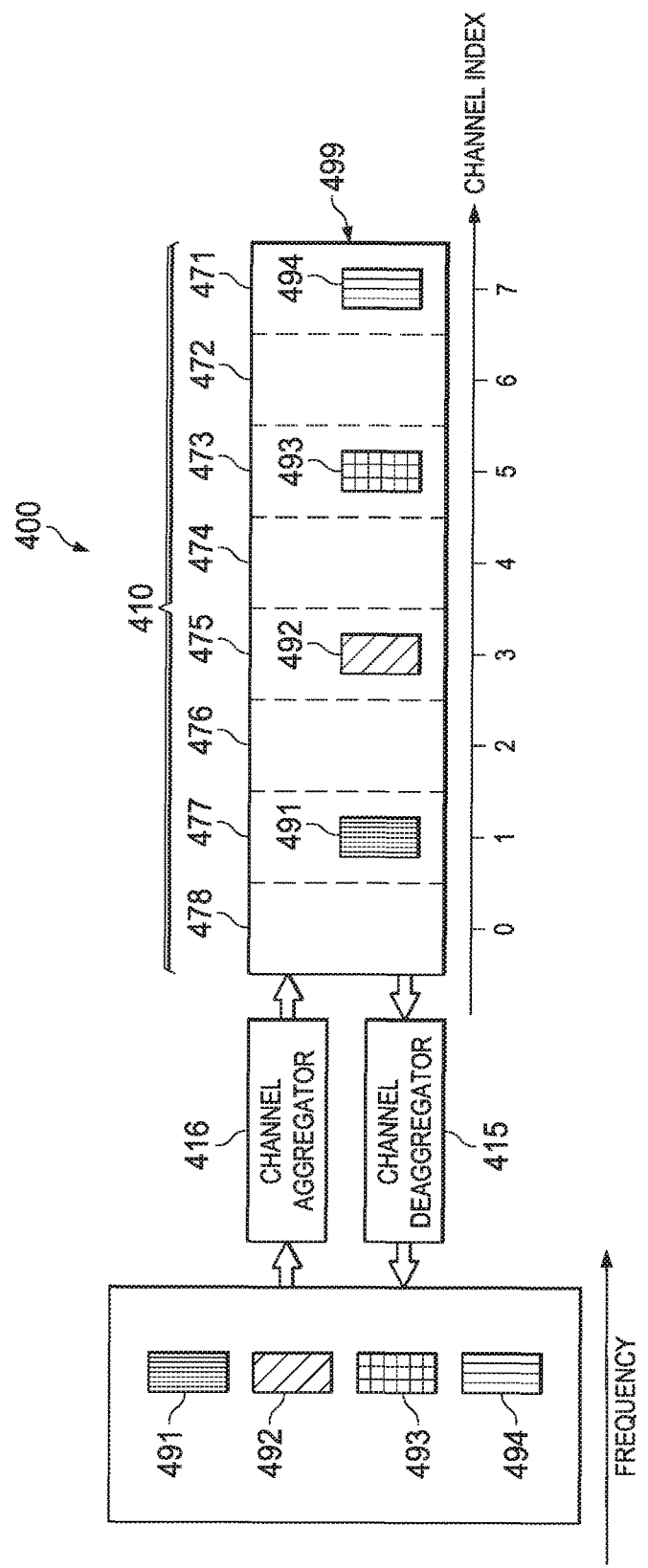
FIG. 4 is an illustration of an odd-only channel mapping scheme.

FIG. 4 is an illustration of an odd-only channel mapping scheme 400 described in the 021 Application. The scheme 400 is employed by a channel aggregation unit 416, which is similar to the digital channel aggregation unit 200 and a channel deaggregation unit 415, which is similar to the digital channel deaggregation unit 300, to mitigate second-order distortions. In the scheme 400, the channel aggregation unit 416 aggregates a plurality of signals 491, 492, 493, 494 into an aggregated signal 499 by employing similar FDM mechanisms as the digital channel aggregation unit 200. Each of the signals 491-994 spans the same bandwidth. The signals 491-994 are similar to the RF signals received and transmitted over the antennas 242. The signals 491-994 may correspond to multiple-input multiple-output (MIMO) signals and RF signals from different cell sectors. The aggregated signal 499 is similar to the aggregated UL signal and the aggregated DL signal transported over the fronthaul link 130. Conversely, a channel deaggregation unit 415 deaggregates the aggregated signal 499 into the signals 491-994 by employing similar frequency demultiplexing and shifting mechanisms as the digital channel deaggregation unit 300.

As shown, the aggregated signal 499 spans a bandwidth 470. The bandwidth 470 is evenly divided into eight frequency channels 471, 472, 473, 474, 475, 476, 477, and 478. The frequency channels 471-478 are indexed from 0 through 7. Although the aggregated signal 499 may carry signals in every channel 471-478, the scheme 400 populates the odd channels 471, 473, 475, and 477 with the signals 491-494. The even channels 472, 474, 476, and 478 remain unused. When transmission of the signals 491-494 produces second-order distortions, the second-order distortions reside in the even channels 472, 474, 476, and 478. Thus, the signals 491-494 carried in the odd channels 471, 473, 475, 477 are not impaired by the second-order distortions.

As an example, the frequency channels 471-478 are centered at multiples of a frequency, represented by $f_0$. Thus, the center frequencies of the odd channels 471, 473, 475, and 477 are represented as $(2n-1)\times f_0$, where n is a positive integer. In wireless RF systems such as LTE systems, wireless RF channel signals are constrained to about ⅔ of the full bandwidth. Thus, a first channel centered at $f_0$ comprises a signal that spans from about $\frac{2}{3}f_0$ to about $4/3f_0$. A second channel centered at $3f_0$ comprises a signal that spans from $8/3f_0$ to $10/3f_0$. Therefore, such an arrangement provides frequency gaps of about $4/3f_0$ between adjacent channels. Numerical simulations and experimental results have shown that the spectral width of the second-order distortion terms reside within these frequency gaps, leaving the spectrum around the odd channels clear of impairment.

Although the channel aggregation mechanisms, the channel deaggregation mechanisms, and the odd-only-channel mapping mechanisms described above are efficient and enable the employment of IM for optical transmission and DD for optical reception, IM transmission comprises certain signal constraints. In an analog optical system such as the system 100, analog electrical signals carrying information data are optically modulated for transmission. An IM transmitter varies the optical power output or optical intensity output of an optical source according to analog electrical signals. The intensity of light is real and positive. Thus, IM operates on signals that are real and positive. The real signal constraint may be satisfied by generating signals with Hermitian symmetric spectra as described with respect to the digital channel aggregation unit 200 at the expense of spectral efficiency since half of the transmitted spectra carry no information. Since optical links usually comprise excess bandwidth, spectral efficiency may not be a concerning factor. However, the positive signal constraint affects system dynamic range and power budget. When the analog electrical signals are alternating current signals, the analog electrical signals comprise positive and negative signal voltages or amplitudes. To satisfy the positive signal constraint, the analog electrical signals are shifted to the positive amplitude range by adding a constant DC offset to the analog electrical signals. A DCO transfer function is shown as follows:

$$Y_{DC} = X + X_M, \quad (1)$$

where X represents an input signal such as the real-valued time domain signal generated by the digital channel aggregation unit 200, $X_M$ represents the DC bias, and $Y_{DC}$ represents the offset signal. The DC bias $X_M$ may be configured such that the offset signal $Y_{DC}$ comprises positive signal amplitudes and an effective noise floor low enough for the application in use. For example, the DC bias $X_M$ is configured according to the standard deviation of the input signal X. The nominal range of the offset signal $Y_{DC}$ is about 0 to about $2X_M$.

Although the DCO approach satisfies the positive signal constraint, it reduces power efficiency since half of the transmitted power carries no information. Another approach is a hard clipping (HC) approach. An HC approach limits a signal based on a pre-determined threshold, producing a flat cutoff or a hard cutoff. For example, negative signal inputs are clipped to a signal value of 0 shown as follows:

$Y_{HC}=X$ when $X>0$, $Y_{HC}=0$ otherwise, (2)

where $Y_{HC}$ represents the hard-clipped signal. Thus, only the positive portion of the signal waveform is transmitted. The hard cutoff causes the slope to comprise discontinuities, thus resulting in high-order harmonics or distortions.

Another approach is AC, which is based on HC. In the AC approach, negative signal inputs are clipped to a signal value of 0, but positive signal inputs are scaled by a constant factor. The AC transfer function is represented as follows:

$Y_{AC}=2X$ when $X>0$, $Y_{AC}=0$ otherwise, (3)

where $Y_{AC}$ represents the asymmetrically clipped signal. $Y_{AC}$ comprises a range twice that of the input signal X. For example, when the input signal X varies between $-X_M$ and $X_M$, the asymmetrically clipped signal $Y_{AC}$ comprises a range of 0 to $2X_M$.

Similar to the HC approach, the AC approach produces a large amount of high-order distortions. However, the AC approach performs well for single-channel OFDM signals in IM optical systems when the OFDM signals only carry data in odd-only frequency subcarriers similar to the scheme 400 as described in J. Armstrong, et al., "Power efficient optical OFDM," Institute of Electrical Engineers (IEE) Electronics Letters, vol. 42, issue 6, pp. 370-371, 16 Mar. 2006, J. Armstrong, et al., "Comparison of asymmetrically clipped optical OFDM and DC-biased optical OFDM in AWGN," Institute of Electrical and Electronics Engineers (IEEE) Communications Letters, vol. 12, pp 343-345, 2008, and J. Armstrong, "OFDM for optical communications," Journal of Lightwave Technology, vol. 27, pp. 189-204, 2009, which are incorporated by reference. When carrying signals in odd-only frequency subcarriers, the AC approach produces even-powered distortion such as second-ordered terms, fourth-order distortion terms, and higher even-ordered terms, which all fall in even channels. Since the odd subcarrier signals are orthogonal to each other, the even-powered distortion terms are also orthogonal to the odd subcarrier signals. Thus, the even-powered distortion does not interfere with the odd subcarrier signals. However, when applying the AC approach and the odd-only-channel mapping to multiple channel signals such as the FDM-based aggregated wireless RF channel signals generated by the digital channel aggregation units 200 and 416, the even-powered distortion terms behave differently. The wireless RF channel signals are not frequency orthogonal to each other as in a single-channel OFDM signal. Without the orthogonality, the high-order distortion terms have distortion spectral bandwidths that are proportional to the order of distortion, thus leaking into the odd channels and interfering with the signals transmitted on the odd channels.

Disclosed herein are embodiments for generating positive-amplitude signals by employing SC in conjunction with odd-only channel mapping to mitigate high-order distortion and to improve power link budget. The disclosed embodiments employ a quadratic function for SC instead of a hard cutoff as in HC and AC. The disclosed embodiments apply the quadratic SC function to signal amplitudes of an input signal so that the output soft-clipped signal comprises positive signal amplitudes. The input signal is generated such that data is carried in odd-only frequency subcarriers. For example, the output soft-clipped signal spans a signal frequency band comprising a plurality of non-overlapping frequency subcarriers, where each frequency subcarrier comprises the same bandwidth and is centered at a center frequency. The frequency subcarriers are also referred to as frequency sub-bands. The odd frequency subcarriers refer to the frequency subcarriers with center frequencies that are odd integer multiples of the lowest center frequency in the plurality of frequency subcarriers. The quadratic SC function comprises a DC component, a linear component based on the input signal, and a second-order component based on the input signal. By employing the quadratic SC function in conjunction with the odd-only channel mapping, the inter-mixing of data signals carried at the odd frequency subcarriers are limited to second-order distortion terms. The second-order distortion terms reside in even frequency subcarriers with center frequencies at even integer multiples of the lowest center frequency, thus preventing SC-induced distortion from interfering with the data signals in the odd frequency subcarriers. The disclosed embodiments improve power efficiency by about 3 decibels (dB) when compared to the DCO scheme. The disclosed embodiments are suitable for use with IM transmission and DD reception. The disclosed embodiments may be applied to single-carrier signals and FDM signals with multiple single-carrier signals such as discrete Fourier transform (DFT)-spread signals and Nyquist pre-filtered signals. Although the disclosed embodiments are described in the context of a wireless fronthaul, the disclosed embodiments are suitable for use in any communication systems.

Figure 5:
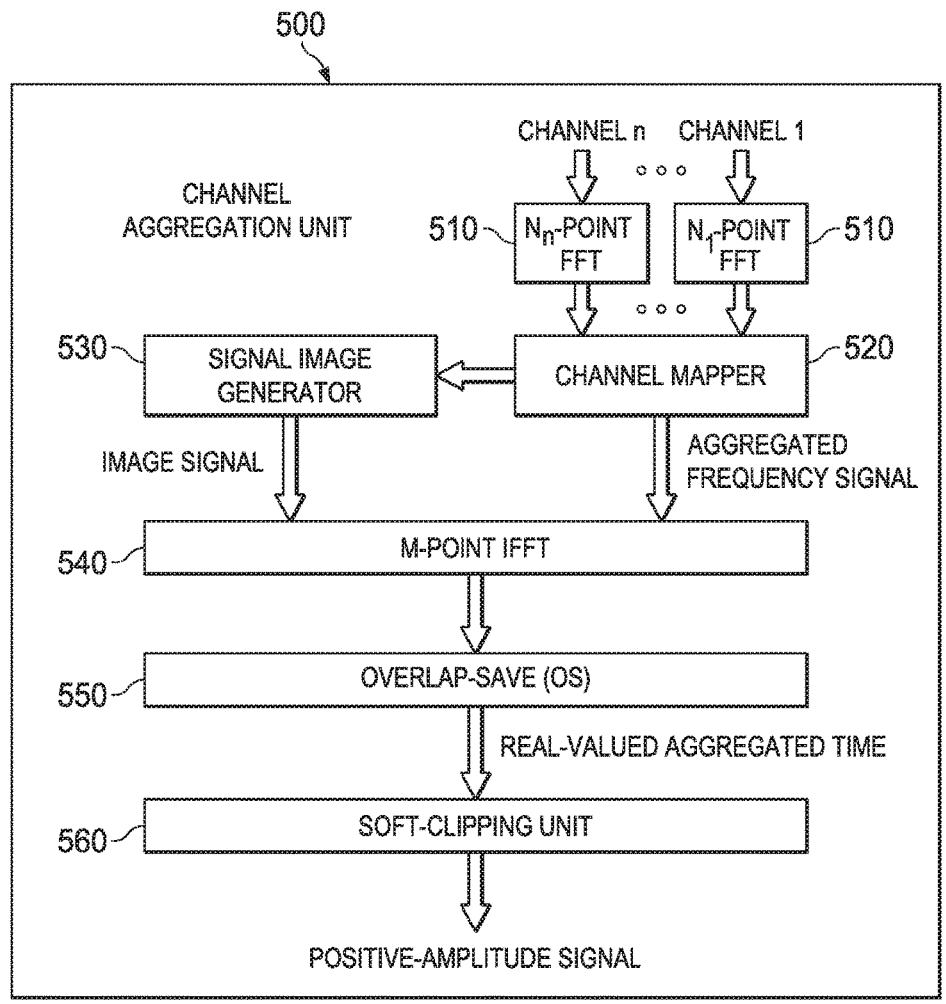
FIG. 5 is a schematic diagram of a digital channel aggregation unit that employs odd-only channel mapping and SC according to an embodiment of the disclosure.

FIG. 5 is a schematic diagram of a digital channel aggregation unit 500 that employs odd-only channel mapping and SC according to an embodiment of the disclosure. The digital channel aggregation unit 500 is employed by the RRU 110 and the BBUs 121. The digital channel aggregation unit 500 may be implemented via software, hardware, and or combinations thereof. The digital channel aggregation unit 500 is similar to the digital channel aggregation unit 200, but performs odd-only channel mapping and SC to enable the employment of IM with improved performance and improved link budget. When employing the digital channel aggregation unit 500 at a transmitter of an RRU or a BBU, a digital channel deaggregation unit similar to the digital channel deaggregation unit 300 may be employed at a receiving RRU or a receiving BBU. The channel demapper 320 may be adjusted to perform demapping according to the odd-only channel mapping.

The digital channel aggregation unit 500 comprises a plurality of FFT units 510, a channel mapper 520, a signal image generator 530, an IFFT unit 540, an OS unit 550, and an SC unit 560. The FFT units 510, the signal image generator 530, the IFFT unit 540, and the OS unit 550 are similar to the FFT units 210, the signal image generator 230, the IFFT unit 240, and the OS unit 250, respectively. The channel mapper 520 is similar to the channel mapper 220, but maps signals onto odd-only channels. For example, the channel mapper 520 employs the scheme 400 to perform odd-only channel mapping. The channel mapper 520 produces an aggregated frequency signal similar to the aggregated frequency signal E(f). The signal image generator 530 produces an image signal similar to the image signal E*(f).

The SC unit 560 is coupled to the OS unit 550. The SC unit 560 is configured to employ an SC bias scheme to convert the real-valued aggregated time signals generated by the OS unit 550 into positive-amplitude signals. The SC unit 560 performs SC by applying a quadratic SC function shown as follows:

$$Y_{SC} = \frac{X_M^2 + 2X_M X + X^2}{2X_M}, \quad (4)$$

where X represents an input signal to the SC unit 560, which corresponds to the real-valued time domain signal generated by the OS unit 550, $X_M$ represents a constant positive value, and $Y_{SC}$ represents the soft-clipped signal or the positive-amplitude signal output by the SC unit 560. Assuming that the domain or the signal range of X is $-X_M$ to $X_M$, then the soft-clipped signal $Y_{SC}$ ranges from 0 to $2X_M$, which is similar to the asymmetrically clipped signal $Y_{AC}$ or other hard-clipped signals. Although the SC bias scheme may not provide as high an improvement gain as the AC bias scheme, the SC bias scheme provides about 3 decibel (dB) of signal improvement compared to the DCO bias scheme. As shown in equation (4), the quadratic SC function comprises a DC component, $X_M^2$, a linear component, $2X_M X$, and a quadratic component, $X^2$.

The SC bias scheme comprises several advantages over the AC bias scheme. For example, the employment of the SC quadratic function produces only second-order distortion terms and no slope discontinuity. The second-order distortion terms comprise distortion spectral bandwidths that are twice that of the signal bandwidth instead of many times that of the original signal bandwidth as in the high-order distortion terms. With wireless RF signals limited to about ⅔ of the full bandwidth and the second-order terms always falling on the even channels, the odd-only channel mapping scheme prevents the second-order distortion from interfering with the wireless RF signals on the odd channels.

The performance of the SC bias scheme, the AC bias scheme, and the DCO bias scheme may be analyzed in terms of linear gains and signal averages. As an example, the input signal X is assumed to be a Gaussian-distributed random signal with zero mean and unit variance. The linear gain of a signal is defined as the weighted average of the derivative of the signal transfer function. The linear gains of a DCO signal as shown in equation (1), an asymmetrically clipped signal as shown in equation (3), and a soft-clipped signal as shown in equation (4) are shown as follows:

$$\overline{Y'_{DC}} = \mathrm{erfc}(-X_M)$$

$$\overline{Y'_{AC}} = 1$$

$$\overline{Y'_{SC}} = \mathrm{erfc}(-X_M), \quad (5)$$

where $\overline{Y'_{DC}}$ represents the linear gain of the DCO signal, erfc is a complementary error function, $\overline{Y'_{AC}}$ represents the linear gain of the asymmetrically clipped signal, $\overline{Y'_{SC}}$ represents the linear gain of the soft-clipped signal, and $X_M$ represents a DC offset. The signal averages of the DCO signal, the asymmetrically clipped signal, and the soft-clipped signal are shown as follows:

$$\overline{Y_{DC}} = X_M \mathrm{erfc}(-X_M) + N_{0,1}(-X_M) \quad (6)$$

$$\overline{Y_{AC}} = \sqrt{\frac{2}{\pi}}$$

$$\overline{Y_{SC}} = 1/2(X_M + 1/X_M)\mathrm{erfc}(-X_M) + 3/2\, N_{0,1}(X_M),$$

where $\overline{Y_{DC}}$ represents the signal average of the DCO signal, $\overline{Y_{AC}}$ represents the signal average of the asymmetrically clipped signal, $\overline{Y_{SC}}$ represents the signal average of the soft-clipped signal, $X_M$ represents a DC offset, and $N_{0,1}$ is a normal distribution function with zero mean and unit standard deviation.

FIG. 6 is a graph 600 comparing linear gains, signal averages, and power benefit of a DCO bias scheme, an AC bias scheme, and an SC bias scheme according to an embodiment of the disclosure. The x-axis represents DC offsets in units of constant standard deviations, the left y-axis represents linear gains and averages in constant units, and the right y-axis represents power benefit in units of dB. Power benefit is defined as a ratio between a linear gain and transmitted power. The graph 600 is generated by applying DCO bias, AC bias, and SC bias to an OFDM input signal according to equations (1), (3), and (4), respectively.

The curve 610 shows DCO gains and SC gains as a function of DC offsets. The curve 620 shows DCO averages as a function of DC offsets. The curve 630 shows SC averages as a function of DC offsets. The curve 610 is derived according to equation (10). The curves 620 and 630 are derived according to equation (11). As shown by the curve 610, both the DCO scheme and the SC scheme comprise a nearly constant gain for all DC offsets. As shown by the curves 620 and 630, both the DCO scheme and the SC scheme comprise an average level that increases with DC offsets. However, the SC scheme's average level increases at a slower rate than the DCO scheme. As shown in equations (3) and (5), the AC scheme does not have a DC offset, thus the AC bias scheme comprises a constant gain and a constant average level, which are not shown in the graph 600.

The curves 640 and 650 show power benefits provided by the AC bias scheme and the SC bias scheme, respectively. As shown by the curve 650, the SC bias scheme provides a power benefit of about 2.5 dB at a DC offset of about 3 standard deviations, which may be a practical bias condition, and the power benefit converges to about 3 dB as the DC offset increases. Comparing the curves 640 and 650, the AC scheme provides greater power benefit than the SC scheme and the power benefit increases with increasing DC offsets instead of converging to an about 3 dB power benefit as in the SC scheme. However, the AC scheme may not be applied to FDM transmissions with multiple channels, even when used in conjunction with odd-channel-only mapping due to the lack of orthogonality in the multiple channels as described above.

FIG. 7 is a graph 700 comparing BER performance of a DCO bias scheme, an AC bias scheme, and an SC bias scheme according to an embodiment of the disclosure. The x-axis represents received power in units of decibel milliwatts (dBm). The y-axis represents BER in constant units in a logarithmic scale. The graph 700 is generated from an experimental setup comprising a transmitter and a receiver. The transmitter generates a 2.5 gigabits per second (Gbps) single-channel OFDM signal with odd subcarrier modulation and converts the single-channel OFDM signal to a positive-amplitude signal. The transmitter applies IM to convert the positive-amplitude signal to an optical signal and transmits the optical signal over a fiber length of about 20 kilometer (km). After transmission over the optical link, the receiver employs DD to receive the transmitted optical signal and measure the BER.

The curves 710 and 720 show measured BER as a function of received power when applying DCO bias according to equation (1), followed by HC according to equation (2) with a transmit power of about 5.7 dBm and about 5 dBm, respectively. The curves 730 and 740 show measured BER as a function of received power when applying SC with a quadratic SC function with a transmit power of about 2 dBm and a cubic SC function with a transmit power of about 0 dBm, respectively. The quadratic SC function is expressed as $(1+x)^2/2$, and the cubic SC function is expressed as $(1+x)^3/3$, where x represents the OFDM signal when the mean input signal amplitude of x is normalized to 1. As shown, both SC cases provide better BER performance than DCO bias with HC. The curve 750 shows measured BER as a function of received power when applying AC according to equation (3) with a transmit power of about −1 dBm. Although AC provides better BER performance than SC for a single-channel OFDM signal, AC may not be applied to FDM transmissions with multiple channels, even when used in conjunction with odd-channel-only mapping, due to the lack of orthogonality in the multiple channels as described above.

Figure 8:
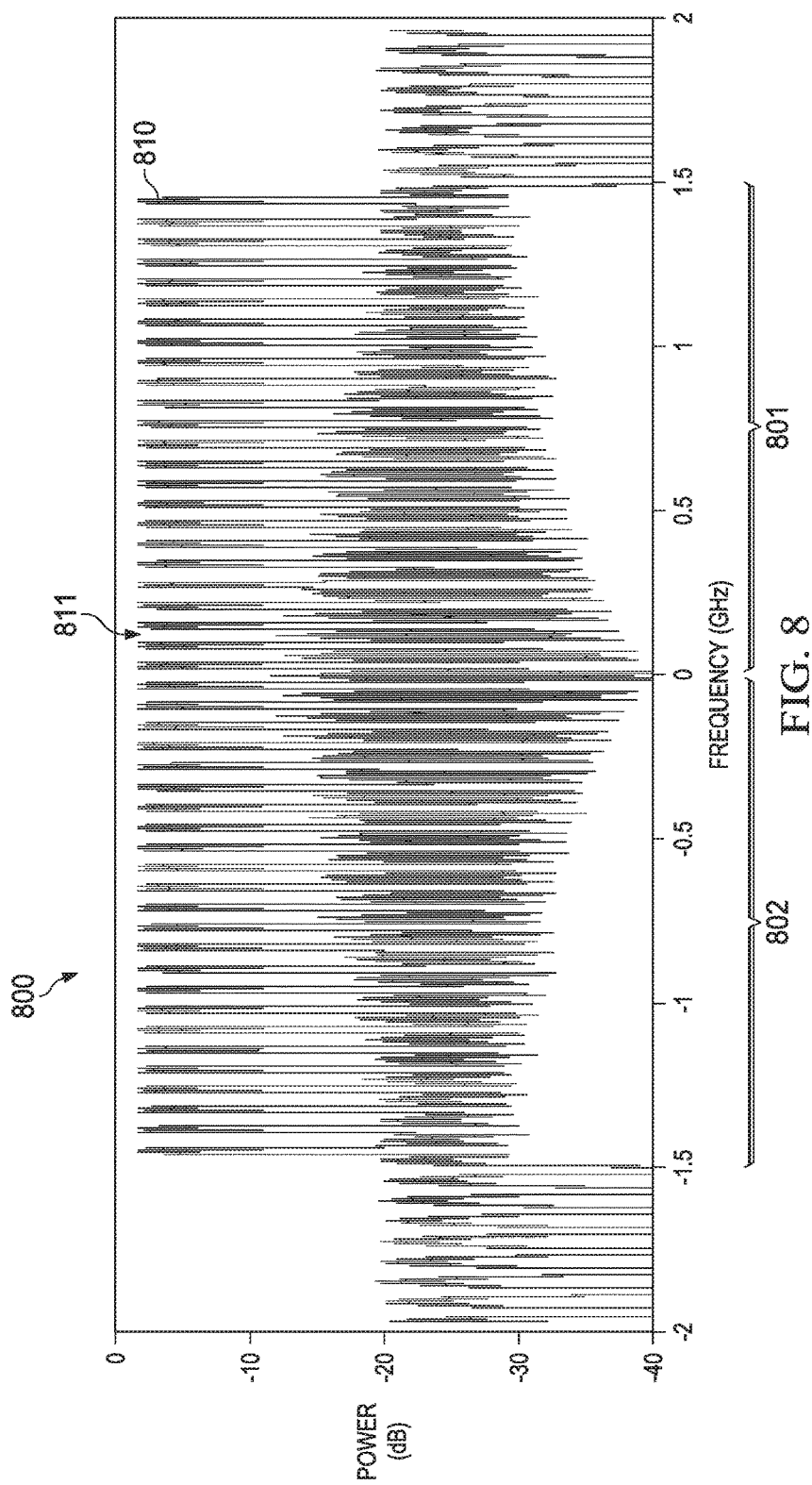
FIG. 8 is a graph illustrating a simulated spectrum of an aggregated Long-Term Evolution (LTE) signal under an SC bias condition according to an embodiment of the disclosure.

FIG. 8 is graph 800 illustrating a simulated spectrum 810 of an aggregated LTE signal under an SC bias condition according to an embodiment of the disclosure. The x-axis represents frequency in gigahertz (GHz), and the y-axis represents power in dB. The aggregated LTE signal is generated by employing a digital channel aggregation unit similar to the digital channel aggregation unit 500. The aggregated LTE signal is an aggregation of twenty-four 20 megahertz (MHz) LTE signals. The LTE signals are mapped onto odd-only channels by employing the scheme 400. The aggregated LTE signal is soft-clipped according to equation (4). The spectrum 810 shows the original twenty-four LTE signals in the positive frequencies 801 and the image of the original twenty-four LTE signals in the negative frequencies 802 produced by the use of Hermitian symmetry. The 24 LTE signals are mapped onto odd-only channels, thus spectral gaps 811 are present between adjacent LTE signals. The spectral gaps correspond to even channels. As shown, inter-signal mixing causes distortions only in the spectral gaps 811, and thus avoids performance degradation to actual signals.

Figure 9:
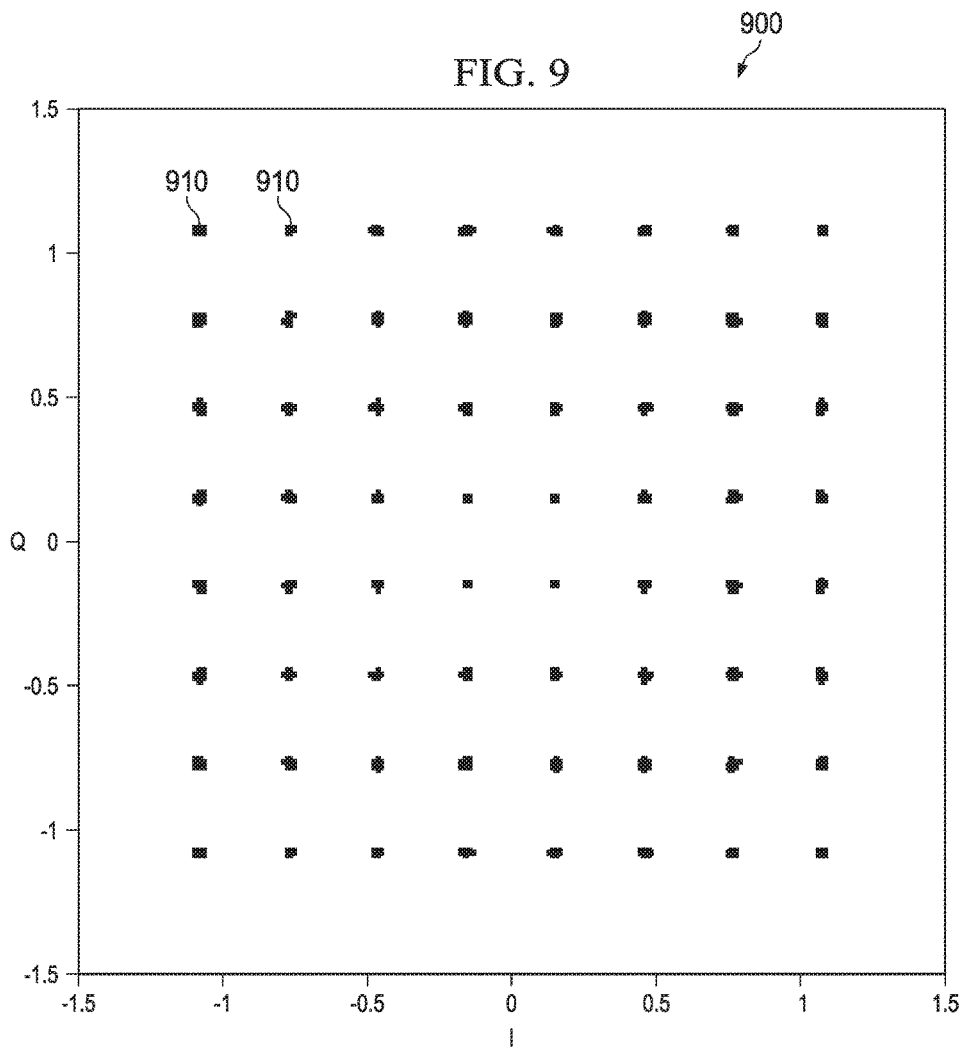
FIG. 9 is a graph illustrating a constellation of an LTE channel signal recovered from a simulated soft-clipped aggregated LTE signal according to an embodiment of the disclosure.

FIG. 9 is a graph 900 illustrating a constellation of an LTE channel signal recovered from a simulated soft-clipped aggregated LTE signal according to an embodiment of the disclosure. The x-axis represents in-phase (I) components, and the y-axis represents quadrature-phase (Q) components, where the I components and the Q components are in some constant units. The constellation points 910 are recovered from the soft-clipped aggregated LTE signal of the spectrum 810. The constellation points 910 are obtained after deaggregating the soft-clipped aggregated LTE signal by employing a channel deaggregation unit similar to the digital channel deaggregation units 300 and 415. The constellation points 910 correspond to the 24$^{th}$ LTE channel. As shown, the constellation points 910 form distinct groups, achieving a low EVM of about 0.5 percent (%). Thus, SC performs well for FDM-based signals.

Figure 10:
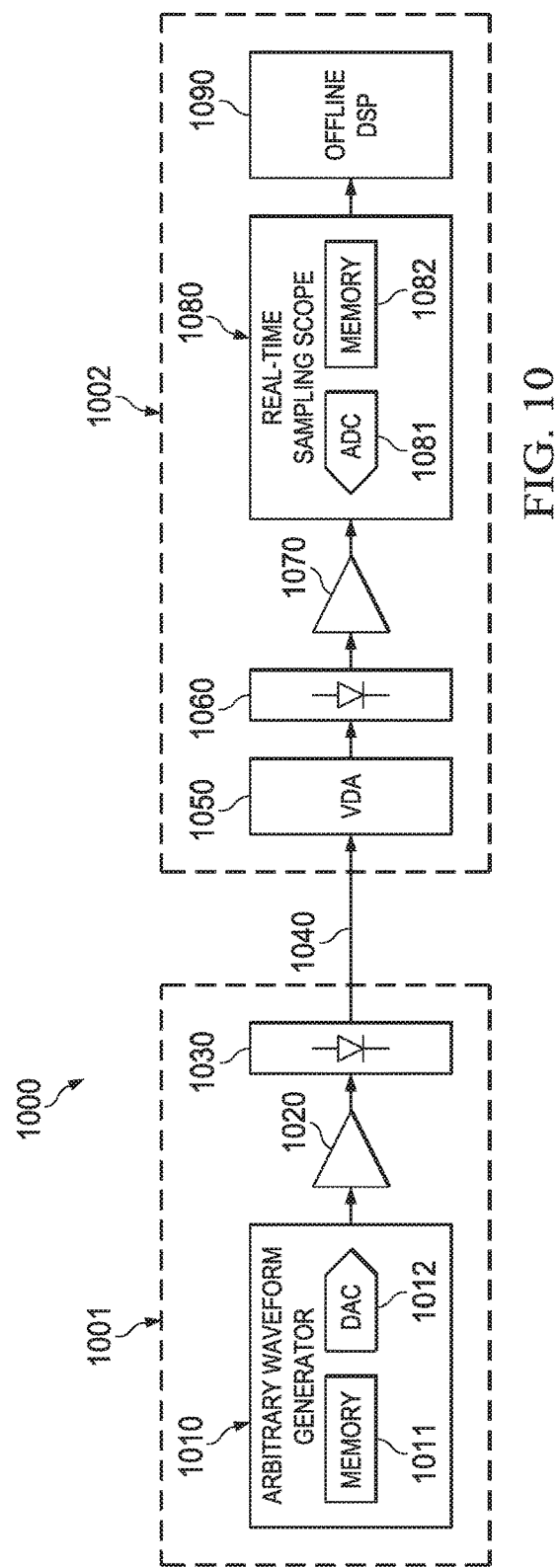
FIG. 10 is a schematic diagram of an experimental setup for evaluating the performance of an SC bias scheme in comparison to a DCO bias scheme according to an embodiment of the disclosure.

FIG. 10 is a schematic diagram of an experimental setup 1000 for evaluating the performance of an SC bias scheme in comparison to a DCO bias scheme according to an embodiment of the disclosure. The DCO bias scheme employs equation (1), and the SC bias scheme employs equation (4). The setup 1000 comprises a transmitter 1001 connected to a receiver 1002 via an SSMF comprising a length of about 20 km. The SSMF 1040 is similar to the fronthaul link 130. The transmitter 1001 comprises an arbitrary waveform generator 1010, a first power amplifier (PA) 1020, and a direct modulation laser (DML) 1030. The receiver 1002 comprises a variable optical attenuator (VOA) 1050, an avalanche photodiode (APD) 1060, a second PA 1070, a real-time sampling scope 1080, and an offline digital signal processor (DSP) 1090.

The first PA 1020 and the second PA 1070 are electrical devices configured to amplify signals. The DML 1030 is an optical device that converts electrical signals to optical signals. The VOA 1050 is an optical device that varies the optical power of an optical signal. The APD 1060 is an optical device that converts optical signals to electrical signals. The offline DSP 1090 is a processor that performs signal processing functions. The arbitrary waveform generator 1010 comprises a memory 1011 and a digital-to-analog converter (DAC) 1012. The arbitrary waveform generator 1010 is configured to store aggregated LTE signals comprising twelve 20-MHz LTE OFDM signals with 64 quadrature-amplitude modulation (64QAM)-subcarrier modulation in the memory 1011. The aggregated LTE signal is generated offline by employing similar mechanisms as the digital channel aggregation unit 500. For example, the LTE signals are mapped onto odd-only channels as shown in graph 900. To evaluate the performance of the SC bias scheme, the aggregated LTE signal is soft-clipped according to equation (4). Conversely, to evaluate the performance of the DCO bias scheme, the aggregated LTE signal is offset according to equation (1). The DAC 1012 is configured to convert the aggregated LTE signal into an analog signal at about 5 gigasamples per second (GSa/s). The first PA 1020 is coupled to the arbitrary waveform generator 1010 and configured to amplify the analog signal into voltage levels suitable for driving the DML 1030. The DML 1030 is coupled to the first PA 1020 and configured to convert the analog electrical signal into an optical signal. The optical signal is transmitted over the SSMF 1040.

After fiber transmission, the VOA 1050 varies the optical power of the transmitted optical signal. The APD 1060 is coupled to the VOA 1050 and configured to convert the optical signal that carries the aggregated signal into an analog electrical signal. The second PA 1070 is coupled to the APD 1060 and configured to amplify the analog electrical signal into voltage levels suitable for optical receiver processing. The real-time sampling scope 1080 comprises memory 1082 and an analog-to-digital converter (ADC) 1081. The ADC 1081 is configured to convert the received analog electrical signal into a digital signal at a rate of about 10 GSa/s. The digitized samples are stored in the memory 1082 and processed offline by the offline DSP 1090. The offline DSP 1090 performs channel deaggregation, OFDM demodulation, BER measurements, and EVM measurements. The offline DSP 1090 implements channel deaggregation as described for the digital channel deaggregation unit 300.

Figure 11:
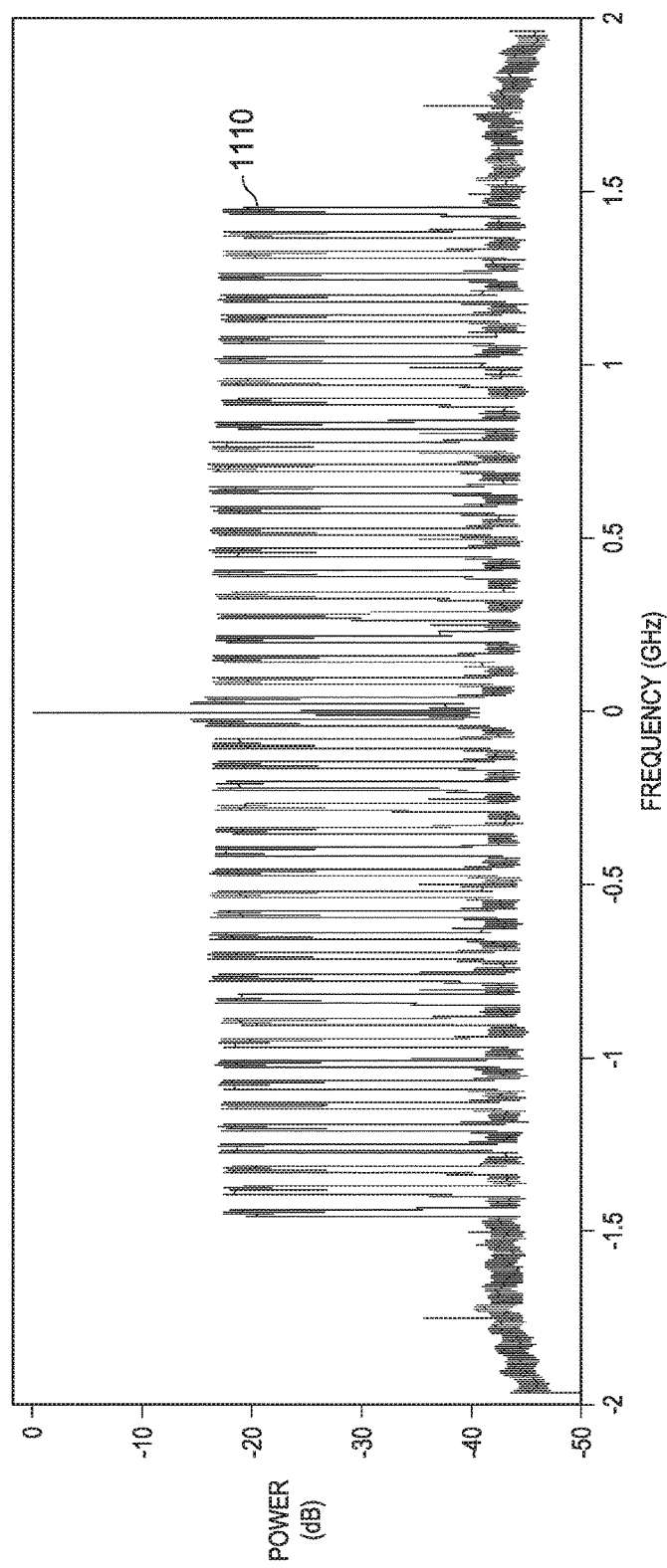
FIG. 11 is a graph illustrating a measured spectrum of an aggregated LTE signal under a DCO bias condition according to an embodiment of the disclosure.
Figure 12:
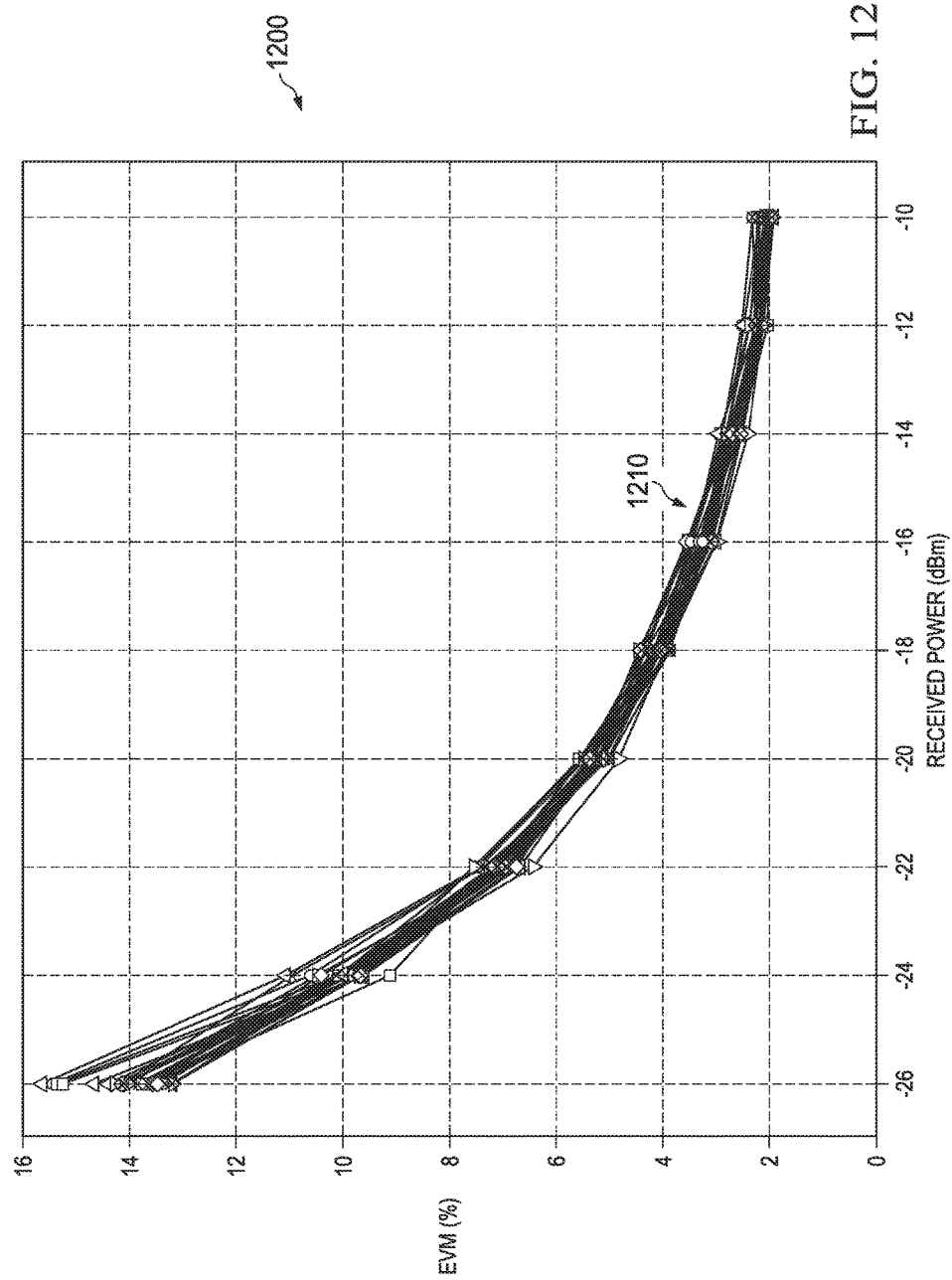
FIG. 12 is a graph illustrating a measured error vector magnitude (EVM) of an aggregated LTE signal under a DCO bias condition according to an embodiment of the disclosure.
Figure 13:
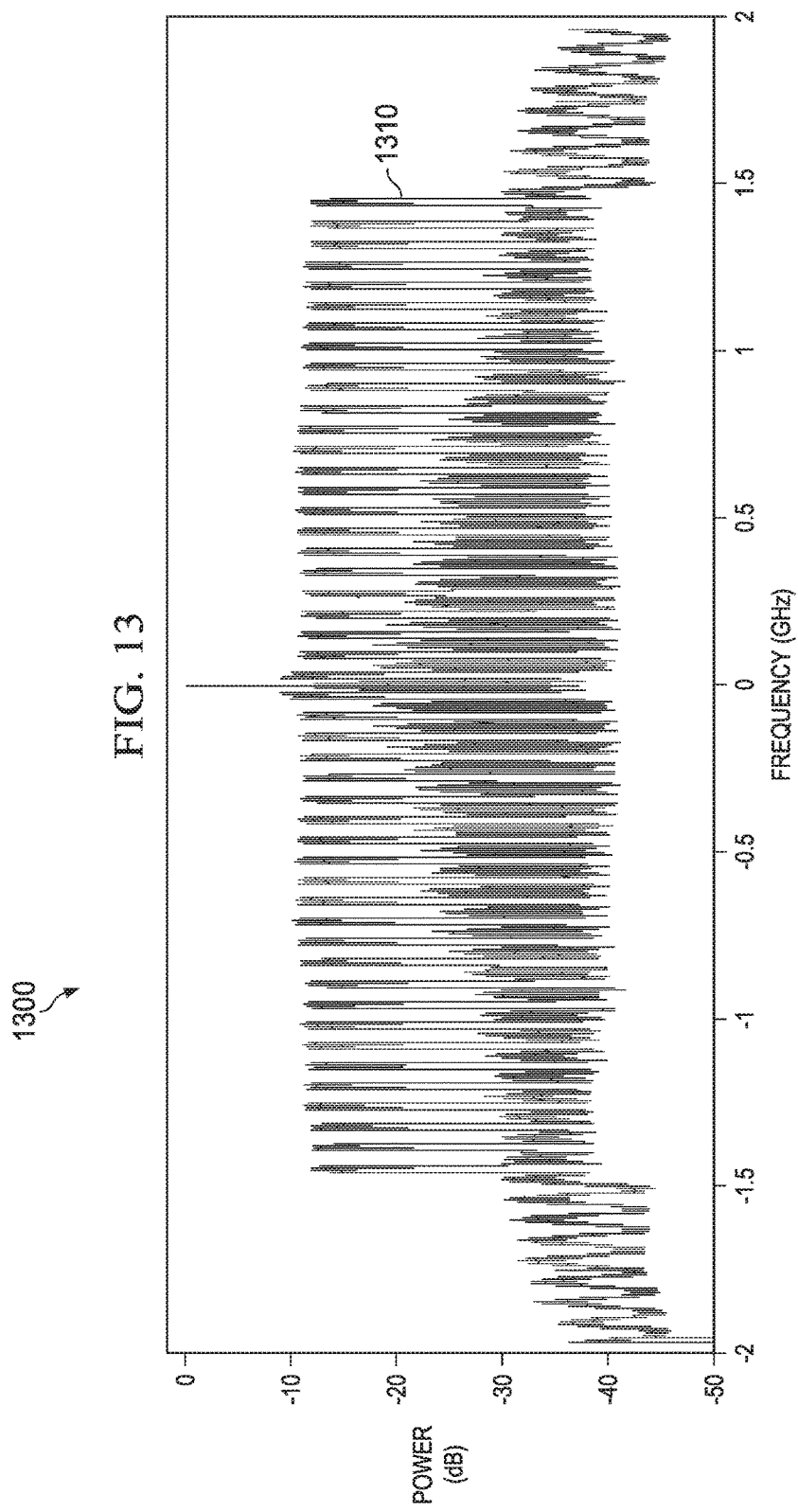
FIG. 13 is a graph illustrating a measured spectrum of an aggregated LTE signal under an SC bias condition according to an embodiment of the disclosure.
Figure 14:
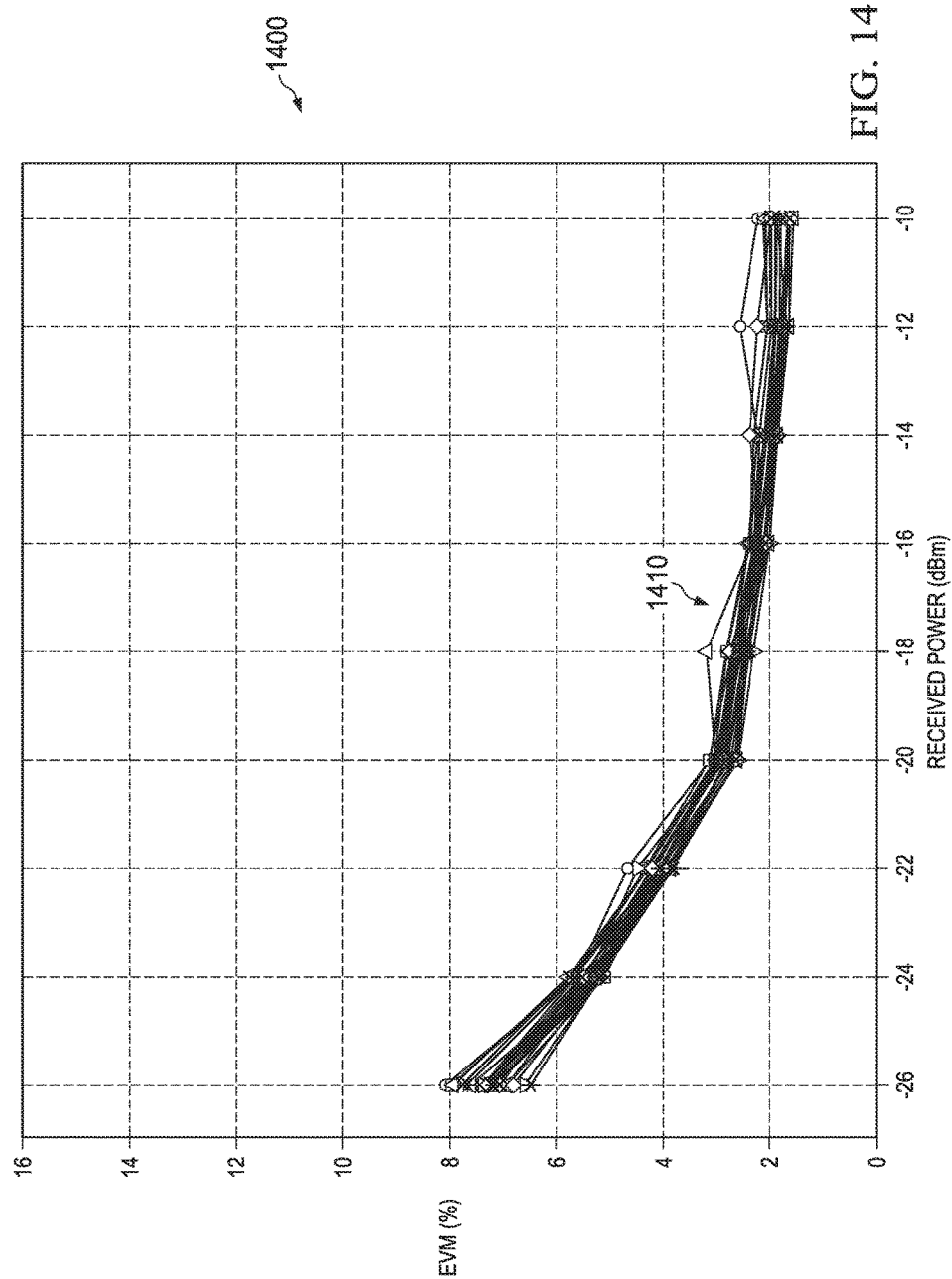
FIG. 14 is a graph illustrating a measured EVM of an aggregated LTE signal under an SC bias condition according to an embodiment of the disclosure.

FIGS. 11-14 compare the performance of the SC bias scheme and the DCO bias scheme for use in a wireless fronthaul. FIGS. 11-14 are generated from measurements obtained from the experimental setup 1000. In FIGS. 11 and 13, the x-axis represents frequency in units of GHz, and the y-axis represents transmit power in units of dB. In FIGS. 12 and 14, the x-axis represents received power in units of dBm, and the y-axis represents an EVM in units of percentage.

FIG. 11 is a graph 1100 illustrating a measured spectrum 1110 of an aggregated LTE signal under a DCO bias condition according to an embodiment of the disclosure. The spectrum 1110 is measured at the receiver 1002 when the transmitter 1001 is configured to transmit aggregate LTE signals generated under DCO bias. The measured received power is about −22 dBm. The spectrum 1110 is shown with power normalized to the power at the center frequency.

FIG. 12 is a graph 1200 illustrating a measured EVM of an aggregated LTE signal under a DCO bias condition according to an embodiment of the disclosure. The curves 1210 show an EVM of the 12 LTE signals measured at the receiver 1002. As shown, in order to achieve a reasonable EVM of about 5%, the received power needs to be higher than about −19 dBm.

FIG. 13 is a graph 1300 illustrating a measured spectrum 1310 of an aggregated signal under an SC bias condition according to an embodiment of the disclosure. The spectrum 1310 is measured at the receiver 1002 when the transmitter 1001 is configured to transmit aggregate LTE signals generated under SC bias. The measured received power is about −22 dBm. Similar to the spectrum 1110, the spectrum 1310 is shown with power normalized to the power at the center frequency.

FIG. 14 is a graph 1400 illustrating a measured EVM of an aggregated LTE signal under an SC bias condition according to an embodiment of the disclosure. Curves 1410 show an EVM of the 12 LTE signals measured at the receiver 1002. Comparing the curves 1410 and the spectrum 1310, an EVM of less than about 5% is achieved when the received power is greater than about −22 dBm under the SC bias instead of −19 dBm under the DC bias. Thus, the SC bias scheme provides a power budget improvement of about 3 dB when compared to the DCO bias scheme.

Figure 15:
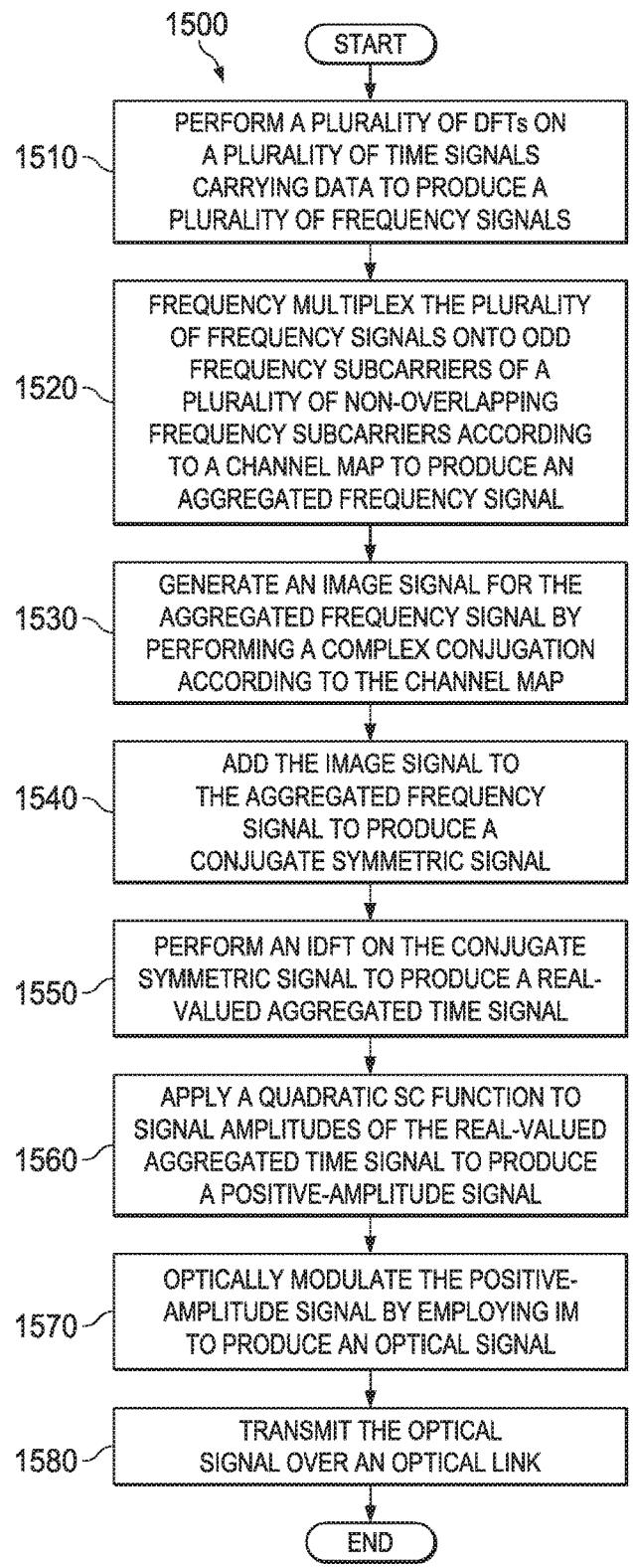
FIG. 15 is a flowchart of a method for aggregating channels according to an embodiment of the disclosure.

FIG. 15 is a flowchart of a method 1500 for aggregating channels according to an embodiment of the disclosure. The method 1500 is implemented by an RRU such as the RRU 110 and a BBU such as the BBUs 121. The method 1500 is implemented when aggregating multiple channel signals for transmission over an optical link such as the fronthaul link 130. The method employs similar mechanisms as the digital channel aggregation unit 500. At step 1510, a plurality of DFTs is performed on a plurality of time signals modulated with data to produce a plurality of frequency signals. In one embodiment, the plurality of time signals corresponds to the RF UL channel signals received over the antennas 142. In another embodiment, the plurality of time signals corresponds to the RF DL channel signals transmitted over the antennas 142. The time domain signals may be BB signals or any other intermediate frequency band signals. At step 1520, the plurality of frequency signals is mapped onto odd frequency subcarriers of a plurality of non-overlapping frequency subcarriers according to a channel map to produce an aggregated frequency signal. Each of the plurality of non-overlapping frequency subcarriers comprises a center frequency that is an odd integer multiple of a lowest center frequency of the plurality of non-overlapping frequency subcarriers. For example, the mapping is similar to the scheme 400. At step 1530, an image signal is generated for the aggregated frequency signal by performing a complex conjugation according to the channel map. At step 1540, the image signal is added to the aggregated frequency signal to produce a conjugate symmetric signal. At step 1550, an IDFT is performed on the conjugate symmetric signal to produce a real-valued aggregated time signal. At step 1560, a quadratic SC function is applied to signal amplitudes of the real-valued aggregated time signal to produce a positive-amplitude signal. For example, the quadratic SC function is as shown in equation (3). SC causes the positive-amplitude signal to comprise second-order distortion that is located at even frequency subcarriers of the plurality of non-overlapping frequency subcarriers. The center frequencies of the even frequency subcarriers are even integer multiples of the lowest center frequency. At step 1570, the positive-amplitude signal is optically modulated by employing IM to produce an optical signal. At step 1580, the optical signal is transmitted over an optical link similar to the link 130.

Figure 16:
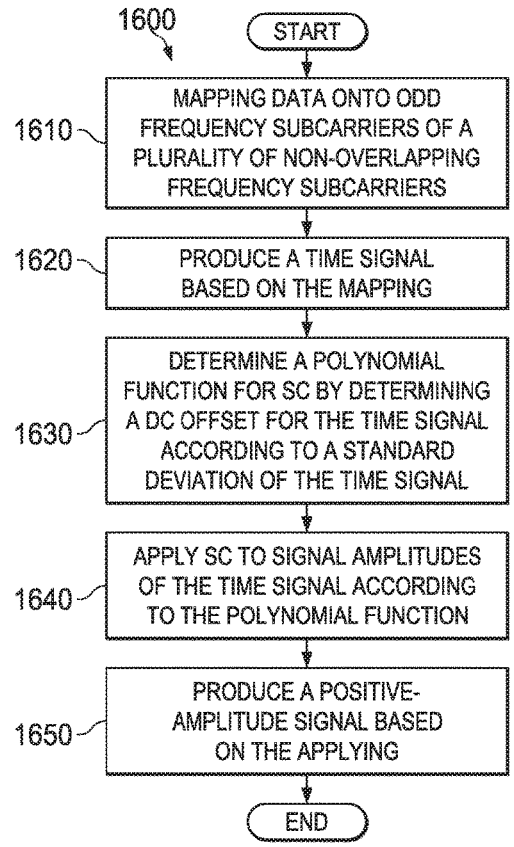
FIG. 16 is a flowchart of a method for performing SC according to an embodiment of the disclosure.

FIG. 16 is a flowchart of a method 1600 for performing SC according to an embodiment of the disclosure. The method 1600 is implemented by an RRU such as the RRU 110 and a BBU such as the BBUs 121. The method 1600 is implemented when converting a signal into a positive-amplitude signal for optical modulation such as IM. The method 1600 employs similar mechanisms as the digital channel aggregation unit 500 and the method 1500. At step 1610, data is mapped onto odd frequency subcarriers of a plurality of non-overlapping frequency subcarriers. Each of the plurality of non-overlapping frequency subcarriers comprises a center frequency that is an odd integer multiple of a lowest center frequency of the plurality of non-overlapping frequency subcarriers. At step 1620, a time signal is produced based on the mapping of the data. In one embodiment, the data is carried in modulated signals. In such an embodiment, the time signal is generated by performing the steps of 1510-1550 of the method 1500. In another embodiment, the data is modulated onto the odd frequency subcarriers by employing OFDM modulation. At step 1630, a polynomial function is determined for SC by determining a DC offset for the time signal according to a standard deviation of the time signal. At step 1640, SC is applied to signal amplitudes of the time signal according to a polynomial function. For example, the polynomial function is a quadratic function similar to the SC function shown in equation (4). At step 1650, a positive-amplitude signal is produced based on the applying of the SC. The polynomial function generates distortion terms that are located at even frequency subcarriers of the plurality of non-overlapping frequency subcarriers. The center frequencies of the even frequency subcarriers are even integer multiples of the lowest center frequency.

Figure 17:
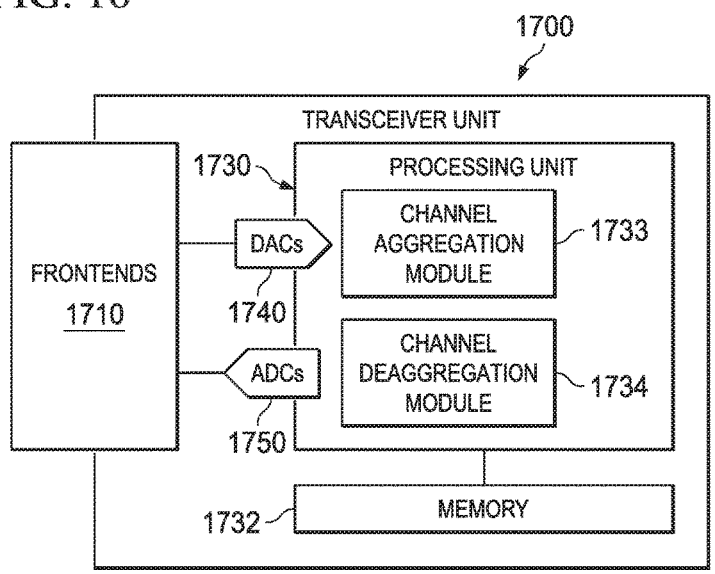
FIG. 17 is a schematic diagram of an embodiment of a wireless fronthaul transceiver unit.

FIG. 17 is a schematic diagram of an embodiment of a wireless fronthaul transceiver unit 1700, which may be any device that transmits or receives optical signals or RF signals. For example, the transceiver unit 1700 may be located in an optical communication device such as the RRU 110 and the BBUs 121 in a wireless fronthaul communication system such as the system 100. The transceiver unit 1700 is suitable for implementing the disclosed embodiments. One skilled in the art will recognize that the term "transceiver unit" encompasses a broad range of devices of which transceiver unit 1700 is merely an example. The transceiver unit 1700 is included for purposes of clarity of discussion, but is in no way meant to limit the application of the present disclosure to a particular transceiver unit embodiment or class of transceiver unit embodiments. At least some of the features and methods described in the disclosure may be implemented in a network apparatus or component such as a transceiver unit 1700. For instance, the features and methods in the disclosure may be implemented using hardware, firmware, and/or software installed to run on hardware. As shown in FIG. 17, the transceiver unit 1700 comprises a plurality of frontends 1710. The frontends 1710 may comprise an optical frontend and/or a RF frontend. For example, the optical frontend may comprise electrical-to-optical (E/O) components and/or optical-to-electrical (O/E) components that convert an electrical signal to an optical signal for transmission in a wireless fronthaul optical network and/or receive an optical signal from the wireless fronthaul network and convert the optical signal to an electrical signal, respectively. The RF frontend may comprise RF components, RF devices that receive and transmit wireless RF signals.

A processing unit 1730 is coupled to the frontends 1710 via a plurality of DACs 1740 and ADCs 1750. For example, the DACs 1740 are similar to the DAC 1012. The ADCs 1750 are similar to the ADC 1081. The DACs 1740 convert digital electrical signals generated by the processing unit 1730 into analog electrical signals that are fed into the frontend 1710. The ADCs 1750 convert analog electrical signals received from the frontends 1710 into digital electrical signals that are processed by the processing unit 1730. In some embodiments, the ADCs 1750 and the DACs 1740 may be integrated with the processing unit 1730. The processing unit 1730 may be implemented as one or more central processing unit (CPU) chips, cores (e.g., as a multi-core processor), field-programmable gate arrays (FPGAs), application specific integrated circuits (ASICs), and DSPs. The processing unit 1730 may comprise a channel aggregation module 1733 and a channel deaggregation module 1734.

The channel aggregation module 1733 implements channel aggregation with odd-only channel mapping and SC as described in the scheme 400, the digital channel aggregation unit 500, the methods 1500 and 1600, and/or other flowcharts, schemes, and methods discussed herein. The channel deaggregation module 1734 implements channel deaggregation as described in the digital channel deaggregation unit 300, and/or other flowcharts, schemes, and methods discussed herein. The inclusion of the channel aggregation module 1733 and the channel deaggregation module 1734 therefore provides a substantial improvement to the functionality of the transceiver unit 1700 and effects a transformation of the transceiver unit 1700 to a different state. In an alternative embodiment, the channel aggregation module 1733 and the channel deaggregation module 1734 may be implemented as instructions stored in the memory 1732, which may be executed by the processing unit 1730.

The memory 1732 comprises one or more disks, tape drives, and solid-state drives and may be used as an overflow data storage device, to store programs when such programs are selected for execution, and to store instructions and data that are read during program execution. The memory 1732 may be volatile and non-volatile and may be read-only memory (ROM), random-access memory (RAM), ternary content-addressable memory (TCAM), and static random-access memory (SRAM).

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method comprising:
    mapping data onto odd frequency subcarriers of a plurality of non-overlapping frequency subcarriers, wherein each of the non-overlapping frequency subcarriers comprises a center frequency that is an odd integer multiple of a lowest center frequency, the mapping comprises performing orthogonal frequency-division multiplexing (OFDM) to modulate the data onto the odd frequency subcarriers;
    producing a time signal based on the mapping;
    applying soft clipping (SC) to signal amplitudes of the time signal according to a polynomial function; and
    producing a positive-amplitude signal based on the applying.

2. The method of claim 1, wherein the polynomial function is a quadratic function.

3. The method of claim 1, wherein the applying the SC to the signal amplitudes of the time signal produces second-order distortions in the positive-amplitude signal.

4. The method of claim 1, further comprising:
    optically modulating the positive-amplitude signal by using intensity modulation (IM) to produce an optical signal; and
    transmitting the optical signal over an optical link.

5. A method comprising:
    mapping data onto odd frequency subcarriers of a plurality of non-overlapping frequency subcarriers, wherein each of the non-overlapping frequency subcarriers comprises a center frequency that is an odd integer multiple of a lowest center frequency, the mapping comprises frequency multiplexing a plurality of frequency signals carrying the data onto the odd frequency subcarriers according to a channel map to produce an aggregated frequency signal;
    producing a time signal based on the mapping;
    applying soft clipping (SC) to signal amplitudes of the time signal according to a polynomial function; and
    producing a positive-amplitude signal based on the applying.

6. The method of claim 5, wherein the producing the time signal further comprises:
    performing complex conjugation on the aggregated frequency signal to produce an image signal, wherein the image signal comprises negative frequencies;
    adding the image signal to the aggregated frequency signal to produce a conjugate symmetric signal;
    performing inverse discrete Fourier transform (IDFT) on the conjugate symmetric signal to produce a real-valued signal in a time domain; and
    producing the time signal based on the real-valued signal.

7. The method of claim 5, wherein the frequency signals correspond to wireless radio frequency (RF) channel signals in a wireless fronthaul.

8. The method of claim 5, wherein each of the non-overlapping frequency subcarriers comprises a first bandwidth, and wherein each of the frequency signals is constrained to a second bandwidth that is less than the first bandwidth.

9. A wireless fronthaul unit comprising:
a radio frequency (RF) frontend configured to receive a plurality of wireless uplink (UL) channel signals; and
a channel aggregation unit coupled to the RF frontend and configured to:
  map the plurality of wireless UL channel signals onto first odd frequency subcarriers of a first plurality of non-overlapping frequency subcarrier to produce an aggregated frequency signal, wherein each of the first plurality of non-overlapping frequency subcarriers comprises a first center frequency that is an odd integer multiple of a lowest first center frequency;
  produce a first aggregated signal in a time domain based on the aggregated frequency signal; and
  apply a quadratic soft clipping (SC) function to signal amplitudes of the first aggregated signal to produce a positive-amplitude signal.

10. The wireless fronthaul unit of claim 9, wherein the quadratic SC function comprises a direct-current (DC) offset that is based on a signal range of the first aggregated signal.

11. The wireless fronthaul unit of claim 10, wherein the quadratic SC function comprises a quadratic term that is based on the signal amplitudes of the first aggregated signal.

12. The wireless fronthaul unit of claim 11, wherein the quadratic SC function comprises a linear term that is based on the signal range and the signal amplitudes.

13. The wireless fronthaul unit of claim 12, wherein the quadratic SC function is represented as:

$$Y_{SC} = \frac{X_M^2 + 2X_M X + X^2}{2X_M},$$

where X represents the first aggregated signal, $X_M$ represents the DC offset, and $Y_{SC}$ represents the positive-amplitude signal.

14. The wireless fronthaul unit of claim 13, wherein the channel aggregation unit is further configured to determine the DC offset according to a standard deviation of the first aggregated signal.

15. The wireless fronthaul unit of claim 9, further comprising an optical frontend coupled to the channel aggregation unit and configured to:
convert the first aggregated signal into an optical signal by using intensity modulation (IM); and
transmit the optical signal over an optical wireless fronthaul link.

16. The wireless fronthaul unit of claim 15, wherein the optical frontend is further configured to receive a second aggregated signal comprising a plurality of wireless downlink (DL) signals mapped onto second odd frequency subcarriers of a second plurality of non-overlapping frequency subcarriers, and wherein each of the second plurality of non-overlapping frequency subcarriers comprises a second center frequency that is an odd integer multiple of a lowest second center frequency.

17. A wireless fronthaul unit comprising:
a processor configured to:
  map a plurality of wireless downlink (DL) channel signals onto first odd frequency subcarriers of a first plurality of non-overlapping frequency subcarriers to produce an aggregated frequency signal, wherein each of the first plurality of non-overlapping frequency subcarriers comprises a first center frequency that is an odd integer multiple of a lowest first center frequency;
  produce a first aggregated signal in a time domain based on the aggregated frequency signal;
  apply a quadratic soft clipping (SC) function to signal amplitudes of the first aggregated signal to produce a positive-amplitude signal; and
an optical frontend coupled to the processor and configured to optically modulate the positive-amplitude signal by applying intensity modulation (IM).

18. The wireless fronthaul unit of claim 17, wherein the quadratic SC function comprises a direct-current (DC) component based on a signal range of the first aggregated signal, a quadratic component based on the signal amplitudes, and a linear component based on the signal range and the signal amplitudes.

19. The wireless fronthaul unit of claim 17, wherein the optical frontend is further configured to receive a second aggregated signal by using direct detection (DD), wherein the second aggregated signal comprises a plurality of wireless uplink (UL) signals mapped onto second odd frequency subcarriers of a second plurality of non-overlapping frequency subcarriers, and wherein each of the second plurality of non-overlapping frequency subcarriers comprises a second center frequency that is an odd integer multiple of a lowest second center frequency.

* * * * *

UNITED STATES PATENT AND TRADEMARK OFFICE
CERTIFICATE OF CORRECTION

PATENT NO. : 9,967,882 B2
APPLICATION NO. : 14/997117
DATED : May 8, 2018
INVENTOR(S) : Frank Effenberger et al.

Page 1 of 1

It is certified that error appears in the above-identified patent and that said Letters Patent is hereby corrected as shown below:

On the Title Page

Page 2, item (56), References Cited, Other Publications, Lines 17-19, should read:

André et al., "Analytical Formulation for SNR Prediction in DMDD OFDM-Based Access Systems," IEEE PHOTONICS TECHNOLOGY LETTERS, VOL. 26, NO. 12, JUNE 15, 2014, pages 1255-1258.

Signed and Sealed this
Twenty-fourth Day of July, 2018

Andrei Iancu
*Director of the United States Patent and Trademark Office*